(12) United States Patent
Hiroki

(10) Patent No.: US 8,380,337 B2
(45) Date of Patent: Feb. 19, 2013

(54) VACUUM PROCESSING APPARATUS AND VACUUM TRANSFER APPARATUS

(75) Inventor: Tsutomu Hiroki, Nirasaki (JP)

(73) Assignee: Tokyo Electron Limited (JP)

( * ) Notice: Subject to any disclaimer, the term of this patent is extended or adjusted under 35 U.S.C. 154(b) by 111 days.

(21) Appl. No.: 12/920,145

(22) PCT Filed: Dec. 16, 2009

(86) PCT No.: PCT/JP2009/006919
§ 371 (c)(1), (2), (4) Date: Aug. 30, 2010

(87) PCT Pub. No.: WO2010/070896
PCT Pub. Date: Jun. 24, 2010

(65) Prior Publication Data
US 2011/0238201 A1    Sep. 29, 2011

(30) Foreign Application Priority Data
Dec. 18, 2008 (JP) .................................. 2008-321942

(51) Int. Cl.
*G06F 19/00* (2011.01)
(52) U.S. Cl. .............................. 700/121; 700/213; 438/3
(58) Field of Classification Search .................. 700/217, 700/254, 229, 121; 438/3, 5; 414/217, 805
See application file for complete search history.

(56) References Cited

U.S. PATENT DOCUMENTS

| | | | | |
|---|---|---|---|---|
| 5,944,857 A | * | 8/1999 | Edwards et al. ............. | 29/25.01 |
| 6,270,582 B1 | * | 8/2001 | Rivkin et al. ................. | 118/719 |
| 6,487,799 B2 | * | 12/2002 | Burk ............................. | 37/403 |
| 6,899,507 B2 | * | 5/2005 | Yamagishi et al. .......... | 414/217 |
| 8,070,408 B2 | * | 12/2011 | Behdjat et al. ............... | 414/217 |
| 8,246,284 B2 | * | 8/2012 | Borden ......................... | 414/217 |
| 2001/0011423 A1 | * | 8/2001 | Kato et al. ........................ | 34/92 |
| 2002/0044860 A1 | | 4/2002 | Hayashi et al. | |
| 2004/0115032 A1 | * | 6/2004 | Ostermann et al. ........... | 414/217 |

FOREIGN PATENT DOCUMENTS

| | | |
|---|---|---|
| JP | 08-046013 | 2/1996 |
| JP | 2004-265947 | 9/2004 |

(Continued)

OTHER PUBLICATIONS

International Search Report—PCT/JP2009/006919 dated Jan. 19, 2010.

(Continued)

*Primary Examiner* — Kidest Bahta

(74) *Attorney, Agent, or Firm* — Cantor Colburn LLP

(57) ABSTRACT

Transfer capability is improved without having to extend a longitudinal space of a platform of a cluster tool downward. In a platform PF, a first transfer robot 16L includes a transfer main body 48L that is slidable on a left guide rail 46L, a transfer pedestal 50L that is slidable in an offset direction (X direction), and a slider type transfer arm 52L that is rotatable within a horizontal surface while being movable straight in a direction parallel to a radius of a rotation circle and supports one piece of a semiconductor wafer W. A second transfer robot 16R has the same configuration and operations as the first transfer robot 16L except that an operation or moving direction of each component of the second transfer robot 16R is vertically symmetrical to that of the first transfer robot 16L.

15 Claims, 18 Drawing Sheets

FOREIGN PATENT DOCUMENTS

| | | |
|---|---|---|
| JP | 2006-073835 | 3/2006 |
| JP | 2006-190894 | 7/2006 |
| JP | 2007-012720 | 1/2007 |
| JP | 2008-030151 | 2/2008 |
| WO | 01/75965 | 10/2001 |

OTHER PUBLICATIONS

Japanese Office Action—Japanese Application No. 2008-321942 issued on Feb. 14, 2012, citing JP 2007-12720, WO 2001/075965, JP 2006-73835, and JP 2008-30151.

* cited by examiner

VACUUM PROCESSING APPARATUS AND VACUUM TRANSFER APPARATUS

TECHNICAL FIELD

The present invention relates to a vacuum processing apparatus and a vacuum transfer apparatus of a cluster tool type.

BACKGROUND ART

A cluster tool type is well-known as a type of a vacuum processing apparatus having a vacuum transfer chamber. In the cluster tool type apparatus, a plurality of process chambers, where predetermined processes are performed at a depressurized state, are disposed around a vacuum platform so as to promote consistency, connectivity, or compositeness of processes. The cluster tool type is also referred to as a multi-chamber type, and is typically employed by a semiconductor manufacturing apparatus (for example, refer to Patent Document 1).

Generally, in a cluster tool, one target object is sequentially transferred to the plurality of process chambers so that the same type or different types of vacuum process is continuously performed on the target object. In the semiconductor device manufacture, a CVD (chemical vapor deposition), sputtering, dry etching, dry cleaning, etc. are the representative vacuum processes performed in the cluster tool.

Since the transferring of the target object throughout the plurality of process chambers is performed through the platform, the interior of the platform always maintains a depressurized state. In order to transfer an unprocessed target object from an atmosphere space to the platform, and to transfer the target object, on which a series of vacuum processes have been finished, out from the platform to the atmosphere space, a load lock chamber of an atmosphere/vacuum interface is also connected to the platform through a gate valve. A vacuum transfer apparatus for receiving/delivering a substrate between each process chamber or the load lock chamber, and the vacuum transfer apparatus at a depressurized state is formed inside the platform. Such a type of vacuum transfer apparatus includes a stretchable transfer arm so as to transfer the target object from and to each process chamber or the load lock chamber, and may rotate the transfer arm according to an access point.

However, in the vacuum processing apparatus of the cluster tool type, a layout, wherein the width size of the entire apparatus, when viewed from a load port side through which a target object cassette is inserted or ejected, is reduced or maintained while the platform is extended long in an inner depth direction thereby installing additional process chambers along the long side of the platform to increase the number of installed chambers in the entire apparatus, has become a trend as a method to advantageously deal with increasing size of a semiconductor wafer (for example, refer to Patent Document 2).

As such, when the number of installed process chambers increases, the burden of the vacuum transfer apparatus increases, and thus a transfer capability of a vacuum transfer apparatus side failing to follow an entire process capability of a processing apparatus side has become a problem.

In this regard, a conventional cluster tool forming one vacuum transfer robot inside a platform uses a method of setting a module cycle time to have substantially the same length, wherein the module cycle time is obtained by adding a stay time of one target object staying in each chamber, to accompanying busy times when a function of a module is stopped due to the target object before and after the stay of the target object with respect to a plurality of process modules connected to the platform, of the vacuum transfer robot, which has two transfer arms, circling the plurality of process modules in the same order as each target object makes a round, and of transferring out (pick) a target object that has been processed through access into each process module by using one of the two transfer arms and alternately transferring in (place) another target object instead of the target object that has been processed by using the other transfer arm (for example, refer to Patent Document 3).

Although, such a circulating pick and place method effectively functions when a process time of each process module is sufficiently long compared to a transfer time, since a transfer operation of the transfer robot has a time to spare, when the process time is short, it becomes difficult for the transfer robot to respond, and thus transfer efficiency or throughput decreases. Meanwhile, if a post-process (for example, purging, cleaning, or the like), which is performed in the process module immediately after the target object that has been processed is transferred out (picked), takes a long time, the transfer robot has to wait in front of the process module until the post-process is completed so as to perform a place operation with respect to the possessed unprocessed target object, and thus throughput of the overall system remarkably deteriorates due to this long standby time.

Also, due to the trend of the increasing number of installed process modules (process chambers) as described above, performing all substrate transfer operations in the platform by using one vacuum transfer robot has reached the limit.

In Patent Document 4, in order to remove the limit to the transfer capability of the platform using one vacuum transfer robot in the cluster tool, the present inventor suggests a vacuum processing apparatus, wherein two movable stages or two arm mechanisms in a common narrow transfer space are moved in an up and down direction and a horizontal direction by two movable stage driving mechanisms in the platform so that the two movable stages or two arm mechanisms switch the locations with each other in the up and down direction in a horizontal state without interfering with each other.

(Patent Document 1) Japanese Laid-Open Patent Publication No. hei 8-46013
(Patent Document 2) Japanese Laid-Open Patent Publication No. 2007-12720
(Patent Document 3) Japanese Laid-Open Patent Publication No. 2006-190894
(Patent Document 4) Japanese Laid-Open Patent Publication No. 2004-265947

DISCLOSURE OF THE INVENTION

Technical Problem

A conventional vacuum processing apparatus disclosed in Patent Document 4 above uses a method of simultaneously operating substantially two transfer robots in a platform, and thus transfer efficiency and throughput may be improved, but there are still some matters to be improved.

First, since each movable stage driving mechanism uses a type of a vertically-articulated robot, which has a base portion at the bottom and is stretchable and rotatable on a vertical plane, a large space is required in a vertical direction. Moreover, two groups of movable stages and arm mechanisms are made to move in an up and down direction to be location-switchable, above the movable stage driving mechanism. Here, the top location of the arm mechanism is set to a height corresponding to a target object transfer-in/out slot of the process chamber. Accordingly, the movable stage driving mechanism (specifically, the base portion) may operate in a location space lower than the process chamber.

However, a recent process module is made to commonly use an APC (Automatic Pressure Control) valve having a large capacity for a vacuum exhaust system, and thus an occupancy space enough for the APC valve to protrude from below the process chamber to a platform side is required. Consequently, a bottom space of the platform lower than the process chamber has to be emptied for the process module, and thus cannot be used for a transfer mechanism.

In other words, a configuration in which the movable stage driving mechanism employing the type of the vertically-articulated robot described above is formed in the platform has become difficult to employ.

Second, since another movable stage passes above a target object supported by each movable stage when height locations of the two movable stages are mutually switched or replaced inside the platform, particles may adhere to the target object.

Third, since acceleration acts upward while moving the movable stage downward, a holding power with respect to the target object weakens, and thus the target object may slide (dislocated).

Also, the movable stage driving mechanism (vertically-articulated robot) does not only requires a large operation space as described above but also has a large scale, and thus is difficult to be executed in terms of expenses.

To address this problem, the present invention provides a vacuum processing apparatus and a vacuum transfer apparatus, which remarkably improve transfer capability by using a vacuum transfer robot having a simple and efficient mechanism and operation without having to extend a longitudinal space of a platform downward in a cluster tool.

Technical Solution

A vacuum processing apparatus according to the present invention includes: a vacuum transfer chamber of which the interior is maintained at a depressurized state; one or more vacuum process chambers, which are formed adjacent to and around the vacuum transfer chamber and where a predetermined process on a target object is performed in a depressurized interior; one or more load lock chambers, which are formed adjacent to and around the vacuum transfer chamber and have the interior that is selectively changed to an atmosphere state or a depressurized state to temporarily lock the target object transmitted between an atmosphere space and the vacuum transfer chamber; first and second vacuum transfer robots formed in the vacuum transfer chamber to transfer the target object, between the load lock chamber and at least one of the vacuum process chambers, or between the vacuum process chambers that are different from each other, wherein the first and second vacuum transfer robots are configured to move inside the vacuum transfer chamber respectively on first and second transfer paths that extend in inner depth directions respectively in a left transfer area and a right transfer area of the vacuum transfer chamber, as viewed from the load lock chamber side, the first vacuum transfer robot has access to all the vacuum process chambers adjacent to the left transfer area, at least one of the vacuum process chambers adjacent to the right transfer area, and at least one of the load lock chambers, so as to transfer in or out the target object, and the second vacuum transfer robot has access to all the vacuum process chambers adjacent to the right transfer area, at least one of the vacuum process chambers adjacent to the left transfer area, and at least one of the load lock chambers, so as to transfer in or out the target object.

Also, in a vacuum processing apparatus including: one or more vacuum process chambers, which are formed adjacent to and around a vacuum transfer chamber and have the interior that is maintained at a depressurized state, and where a predetermined process is performed on a target object in a depressurized interior; and one or more load lock chambers, which are formed adjacent to the transfer chamber and have the interior that is selectively changed to an atmosphere state or a depressurized state to temporarily lock the target object transmitted between an atmosphere space and the vacuum transfer chamber, a vacuum transfer apparatus according to the present invention is formed in the vacuum transfer chamber of the vacuum processing apparatus, and the vacuum transfer apparatus, which receives or delivers the target object between the vacuum transfer chamber and the vacuum process chamber or between the vacuum transfer chamber and the load lock chamber, includes: first and second vacuum transfer robots configured to move inside the vacuum transfer chamber respectively on first and second transfer paths that extend in inner depth directions respectively in a left transfer area and a right transfer area of the vacuum transfer chamber, as viewed from the load lock chamber side, wherein the first vacuum transfer robot has access to all the vacuum process chambers adjacent to the left transfer area, at least one of the vacuum process chambers adjacent to the right transfer area, and at least one of the load lock chambers, so as to transfer in or out the target object, and the second vacuum transfer robot has access to all the vacuum process chambers adjacent to the right transfer area, at least one of the vacuum process chambers adjacent to the left transfer area, and at least one of the load lock chambers, so as to transfer in or out the target object.

According to the vacuum processing apparatus or the vacuum transfer apparatus of the present invention, in the vacuum transfer chamber, the first vacuum transfer robot may use the left transfer area as a main operation area but may be able to stick out to the right transfer area, and meanwhile, the second vacuum transfer robot may use the right transfer area as a main operation area but may be able to stick out to the left transfer area. In other words, according to an embodiment of the present invention, the first vacuum transfer robot may be configured to arbitrarily switch between a basic position, wherein the first vacuum transfer robot is entirely contained in the left transfer area to move, and a position, wherein the first vacuum transfer robot sticks out from the left transfer area to the right transfer area, and the second vacuum transfer robot may be configured to arbitrarily switch between a basic position, wherein the second vacuum transfer robot moves is contained in the right transfer area to move, and a position, wherein the second vacuum transfer robot sticks out from the right transfer area to the left transfer area.

According to an embodiment of the present invention, the first and second vacuum transfer robots may respectively include: first and second transfer main bodies configured to move inside the vacuum transfer chamber respectively on the first and second transfer paths; first and second transfer pedestals installed respectively on the first and second transfer main bodies so as to move in a horizontal offset direction crossing the inner depth direction; and first and second transfer arms installed respectively in the first and second transfer pedestals so as to rotate within a horizontal surface while moving straight in a direction parallel to a radius of a rotation circle, and configured to support the target object.

According to an embodiment of the present invention, since the first and second vacuum transfer robots respectively use the left and right transfer areas as the main operation areas, the first and second transfer main bodies may be configured to slide respectively on the first and second transfer paths, and also to deviate from each other on the first and second transfer paths.

Also, according to another embodiment, in order for the first vacuum transfer robot to stick out from the left transfer area to the right transfer area, the first transfer pedestal may be movable between a first backward location in which the first transfer pedestal is contained within the left transfer area, and a first forward location in which the first transfer pedestal sticks out from the left transfer area to the right transfer area. In addition, in order for the second vacuum transfer robot to stick out from the right transfer area to the left transfer area, the second transfer pedestal may be movable between a second backward location in which the second transfer pedestal is contained within the right transfer area, and a second forward location in which the second transfer pedestal sticks out from the right transfer area to the left transfer area. Here, the first and second transfer pedestals may be installed respectively in the first and second transfer main bodies in such a way that the first and second transfer pedestals are slidable in the offset direction.

In the present invention, the first vacuum transfer robot may be accessible not only to all vacuum process chambers adjacent to the left transfer area, but also to at least one vacuum process chamber adjacent to the right transfer area and also to at least one load lock chamber. Meanwhile, the second vacuum transfer robot may be accessible not only to all vacuum process chambers adjacent to the right transfer area, but also to at least one vacuum process chamber adjacent to the left transfer area and also to at least one load lock chamber.

By combining transfer functions of the first and second vacuum transfer robots and operating them in connection with each other, one transfer robot may first transfer out a target object just in time, and then another transfer robot (the same transfer robot in some cases) may transfer in another target object just in time, with respect to any process chamber.

Also, according to the present invention, since components, i.e., the transfer main bodies, the transfer pedestals, and transfer arms, of the first and second vacuum transfer robots are configured to slide or rotate in a horizontal direction as described above, and the components do not bend, stretch, or rotate in a longitudinal (vertical) direction, a large operation space in the longitudinal (vertical) direction is not required. Accordingly, a longitudinal size of the vacuum transfer chamber may be reduced. In addition, in the vacuum transfer chamber, since a component of a transfer mechanism does not pass above the target object, there is a low possibility that particles adhere to the target object. Also, in the vacuum transfer chamber, since the target object is not accelerated in a longitudinal (vertical) direction (specifically upward), the target object is stably held on the transfer arm.

Moreover, when each component of the transfer robot is made to be a horizontal slide/horizontal rotating type mechanism as described above, a driving source of each component (preferably driving sources of all components) may be disposed outside the vacuum process chamber, and accordingly, a joint duct or a flexible pipe accommodating electric cables is not required to surround inside the vacuum process chamber. Thus, a moving range or a slide stroke of the transfer robot may be increased.

ADVANTAGEOUS EFFECTS

According to a vacuum processing apparatus or a vacuum transfer apparatus of the present invention, transfer capability is remarkably improved by using a vacuum transfer robot having a simple and efficient mechanism and operation without having to extend a longitudinal space of a platform downward in a cluster tool, according to the above structures and operations.

BEST MODE FOR CARRYING OUT THE INVENTION

Hereinafter, embodiments of the present invention will be described in detail with reference to the attached drawings.

Figure 1:
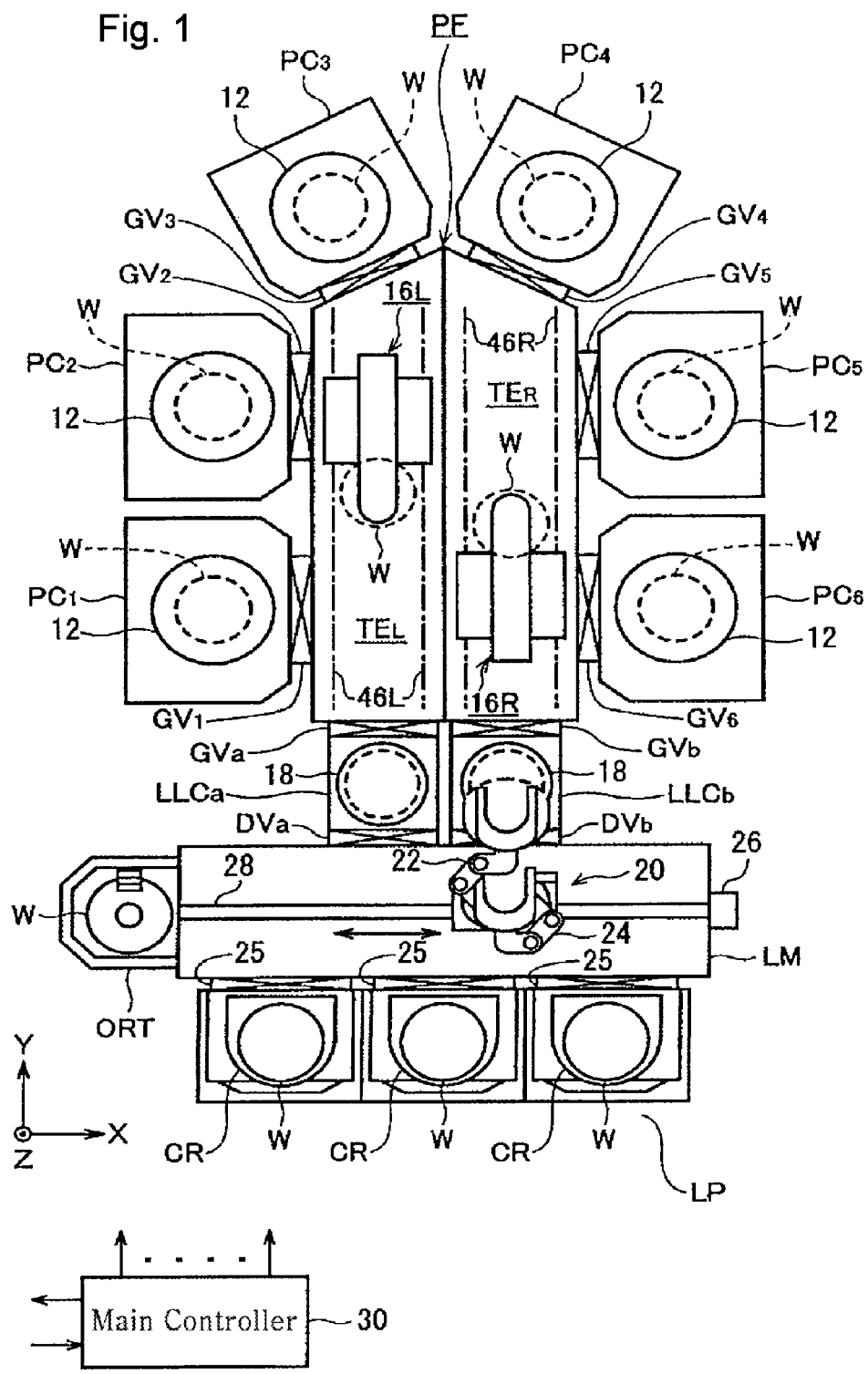
FIG. 1 is a schematic plan view showing a configuration of a vacuum processing apparatus of a cluster tool type, according to an embodiment of the present invention.

FIG. 1 shows the whole configuration of a vacuum processing apparatus of a cluster tool type, according to an embodiment of the present invention. The vacuum processing apparatus is installed in a clean room, and includes six vacuum process chambers $PC_1$, $PC_2$, $PC_3$, $PC_4$, $PC_5$, and $PC_6$ and two load lock chambers $LLC_a$ and $LLC_b$ adjacent to and around a vacuum platform (vacuum transfer chamber) PF having a pentagon shape of which a pair of sides extending in an inner depth direction (Y direction in FIG. 1) in the apparatus are about twice longer than the other sides arranged in a cluster shape.

In detail, the platform is connected to, in a clockwise order in FIG. 1, the first and second process chambers $PC_1$ and $PC_2$ respectively through gate valves $GV_1$ and $GV_2$ on a long left side, the third and fourth process chambers $PC_3$ and $PC_4$ respectively through gate valves $GV_3$ and $GV_4$ on left and right oblique sides, and the fifth and sixth process chambers $PC_5$ and $PC_6$ respectively through gate valves $GV_5$ and $GV_6$ on a right long side. The two load lock chambers $LLC_a$ and $LLC_b$ are connected to a bottom side of the platform respectively through gate valves $GV_a$ and $GV_b$, side by side.

Figure 2:
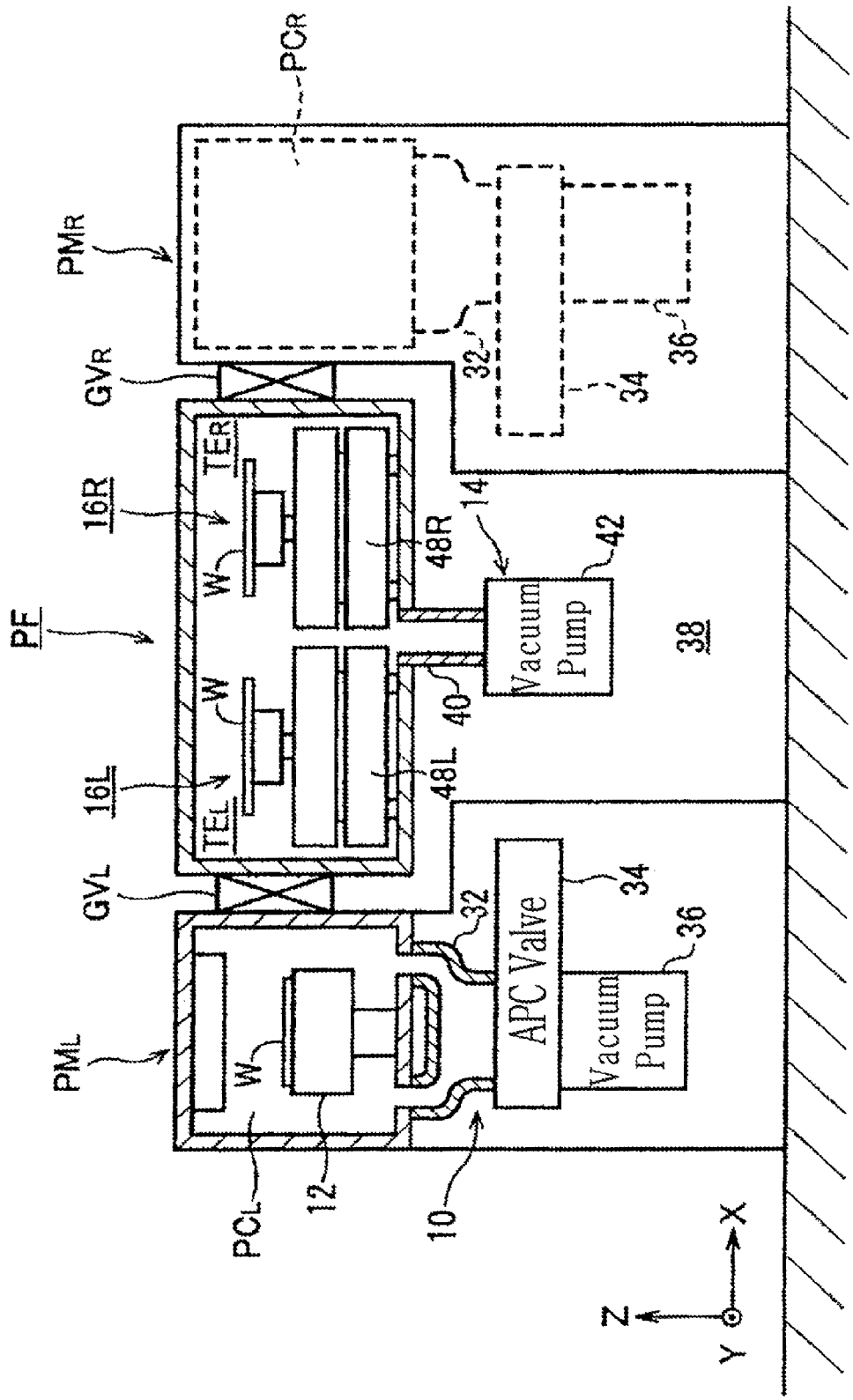
FIG. 2 is a schematic cross-sectional view schematically showing a longitudinal layout of the vicinity of a platform (vacuum transfer chamber) of the vacuum processing apparatus.

Each of the process chambers $PC_1$ through $PC_6$ is connected to an exclusive vacuum exhaust apparatus 10 (FIG. 2), and the interior always maintains a depressurized state with a variable pressure. Typically, as shown in FIG. 2, a target object, for example, a semiconductor wafer W, is placed on a holding stage 12 disposed in the center of the interior, and a required single-wafer processing, for example, a vacuum film-forming process such as CVD, ALD (Atomic Layer Deposition), sputtering, or the like, a thermal process, a cleaning process of a semiconductor wafer is surface, a dry etching process, or the like, is performed by using a predetermined resource (processing gas, high frequency wave, or the like).

The platform PF is connected to an exclusive vacuum exhaust apparatus 14 (FIG. 2), and the interior generally maintains a constant depressurized state with a constant pressure. Two vacuum transfer robots 16L and 16R, which each can independently perform a wafer transfer operation, are installed in the interior. Configurations and operations of the vacuum transfer robots 16L and 16R will be described in detail later.

The load lock chambers $LLC_a$ and $LLC_b$ are connected to an exclusive vacuum exhaust apparatus (not shown) respectively through switch valves, and are each configured in such a way that the interior switches between an atmospheric pressure state and a vacuum state at any time. The load lock chambers $LLC_a$ and $LLC_b$ on a side opposite to the platform PF are connected to a loader transfer chamber LM under an atmospheric pressure, respectively through door valves $DV_a$ and $DV_b$. Receiving/delivering stage 18, on each of which the locked semiconductor wafer W is to be placed, are disposed in the centers of the interiors of the load lock chambers $LLC_a$ and $LLC_b$.

A load port LP and an orientation flat adjusting mechanism ORT are formed adjacent to the loader transfer chamber LM. The load port LP is used to insert or eject, for example, a wafer cassette CR capable of storing 25 semiconductor wafers W per batch into and from an external transfer vehicle. Here, the wafer cassette CR is configured as a box or a pod, such as SMIF (Standard Mechanical Interface), FOUP (Front Opening Unified Pod), or the like. The orientation flat adjusting mechanism ORT is used to adjust an orientation flat or a notch of the semiconductor wafer W in a predetermined location or direction.

An atmosphere transfer robot 20 formed in the loader transfer chamber LM includes a pair of stretchable transfer arms 22 and 24, and is movable in a horizontal direction on a linear guide 28 of a linear motor 26 while being movable up and down and rotatable and thus moves between the load port LP, the orientation flat adjusting mechanism ORT, and the load lock chambers $LLC_a$ and $LLC_b$, and transfers the semiconductor wafer W individually (or in batches). Here, the atmosphere transfer robot 20 transfers the semiconductor wafer W into the load transfer chamber LM, when an LP door 25 formed on a front surface of each wafer cassette CR is opened. The linear guide 28 includes, for example, a magnet formed of a permanent magnet, a magnetic coil for driving, a scale head, etc., and controls a linear movement of the atmosphere transfer robot 20 according to a command from a main controller 30 or an atmosphere transfer system controller (not shown).

FIG. 2 shows a longitudinal layout of the vicinity of the platform PF. In FIG. 2, $PC_L$ and $PC_R$ indicate process chambers respectively disposed adjacent to the left and right sides of the platform PF. The process chambers $PC_L$ and $PC_R$ are included in process modules $PM_L$ and $PM_R$, which are hardware units for performing a required vacuum single-wafer processing. In the left process module $PM_L$, an exhaust pipe 32, an APC valve 34, and a vacuum pump (for example, a turbo molecule pump) 36 included in the vacuum exhaust apparatus 10 are disposed below the process chamber $PC_L$. Here, the APC valve 34 has a big width size, and protrudes under the platform PF. The right process module $PM_R$ has nearly the same layout and size as the left process module $PM_L$.

The platform PF has the same or similar size as the process chambers $PC_L$ and $PC_R$ in a longitudinal direction. A space 38 right below the platform PF has enough room for an exhaust pipe 40 and a vacuum pump 42 included in the vacuum exhaust apparatus 14 to be formed, and thus allows the APC valve 34 to protrude from both process modules $PM_L$ and $PM_R$ inward. Also, the space 38 is used for maintenance of the platform PF and the process modules $PM_L$ and $PM_R$.

Figure 3:
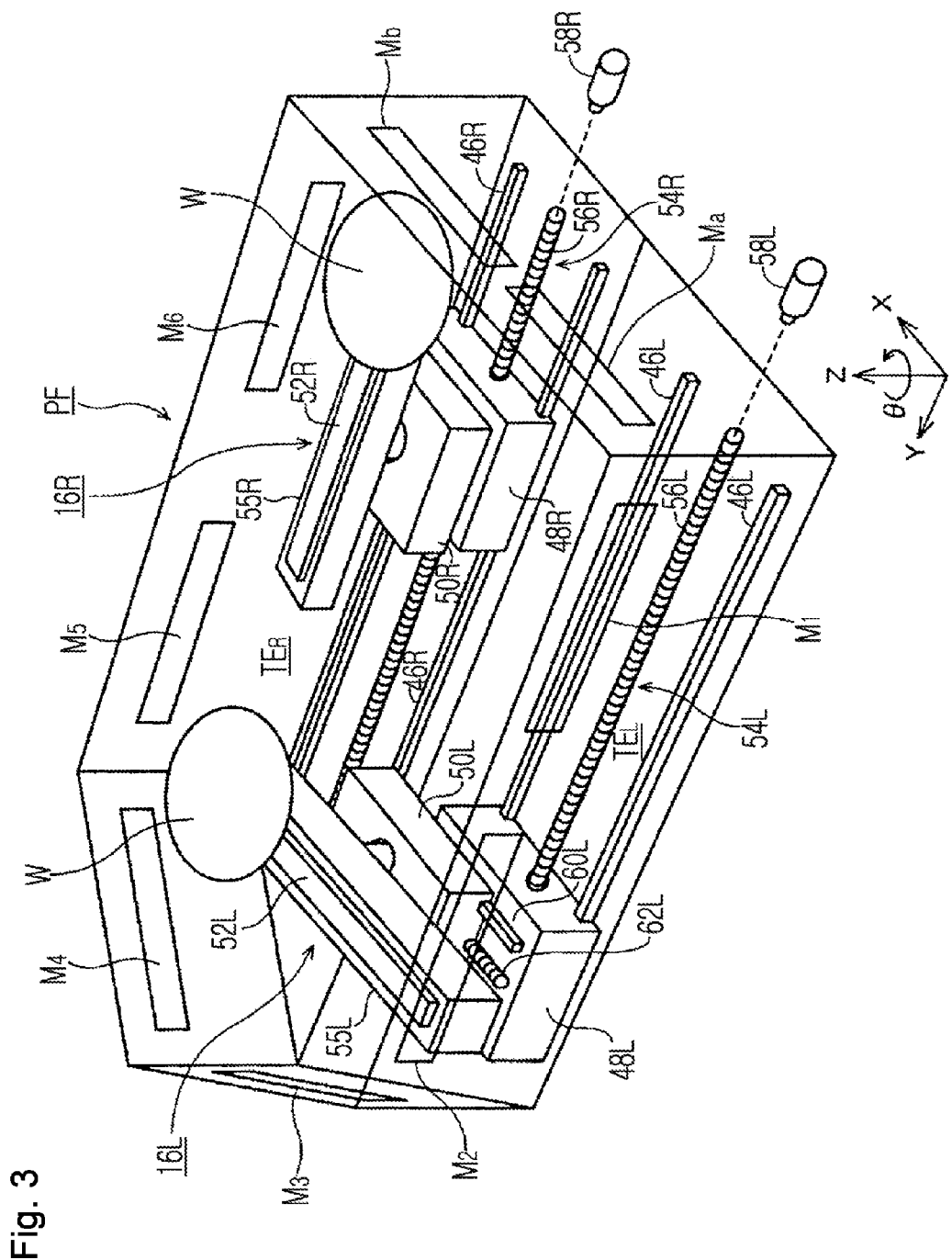
FIG. 3 is a perspective view showing a configuration of first and second vacuum transfer robots formed in a platform of the vacuum processing apparatus.

FIG. 3 shows a configuration of two vacuum transfer robots (hereinafter, simply referred to as transfer robots) 16L and 16R formed inside the platform PF. A transfer space inside the platform PF is transfer-functionally divided equally into right and left as viewed from the load lock chamber $LLC_a$ and $LLC_b$ (FIG. 1) side, and a left guide rail 46L and a right guide rail 46R, which extend in an inner depth direction (Y direction), are respectively laid in the bottom of the left transfer area $TE_L$ and the right transfer area $TE_R$. The first (left) transfer robot 16L is configured to operate on the left guide rail 46L, and the second (right) transfer robot 16R is configured to operate on the right is guide rail 46R.

The first transfer robot 16L includes a transfer main body 48L having a rectangular shape and configured to slide inside the platform PF on the left guide rail 46L, a transfer pedestal 50L having a rectangular shape and installed on the transfer main body 48L so as to slide in a horizontal offset direction (X direction) perpendicular to an inner depth direction (Y direction), and a transfer arm 52L of a slider type (non-bendable type) installed on the transfer pedestal 50L so as to rotate within a horizontal surface while moving straight in a direction parallel to a radius of a rotation circle, and configured to support one piece of semiconductor wafer W.

The transfer main body 48L is driven to move straight by, for example, a ball screw mechanism 54L. In the ball screw mechanism 54L, one end of a transfer screw 56L is combined to a motor 58L disposed outside the platform PF. A ball screw (not shown), which is screw-coupled to the transfer screw 56L, is adhered to the transfer main body 48L.

Figure 17:
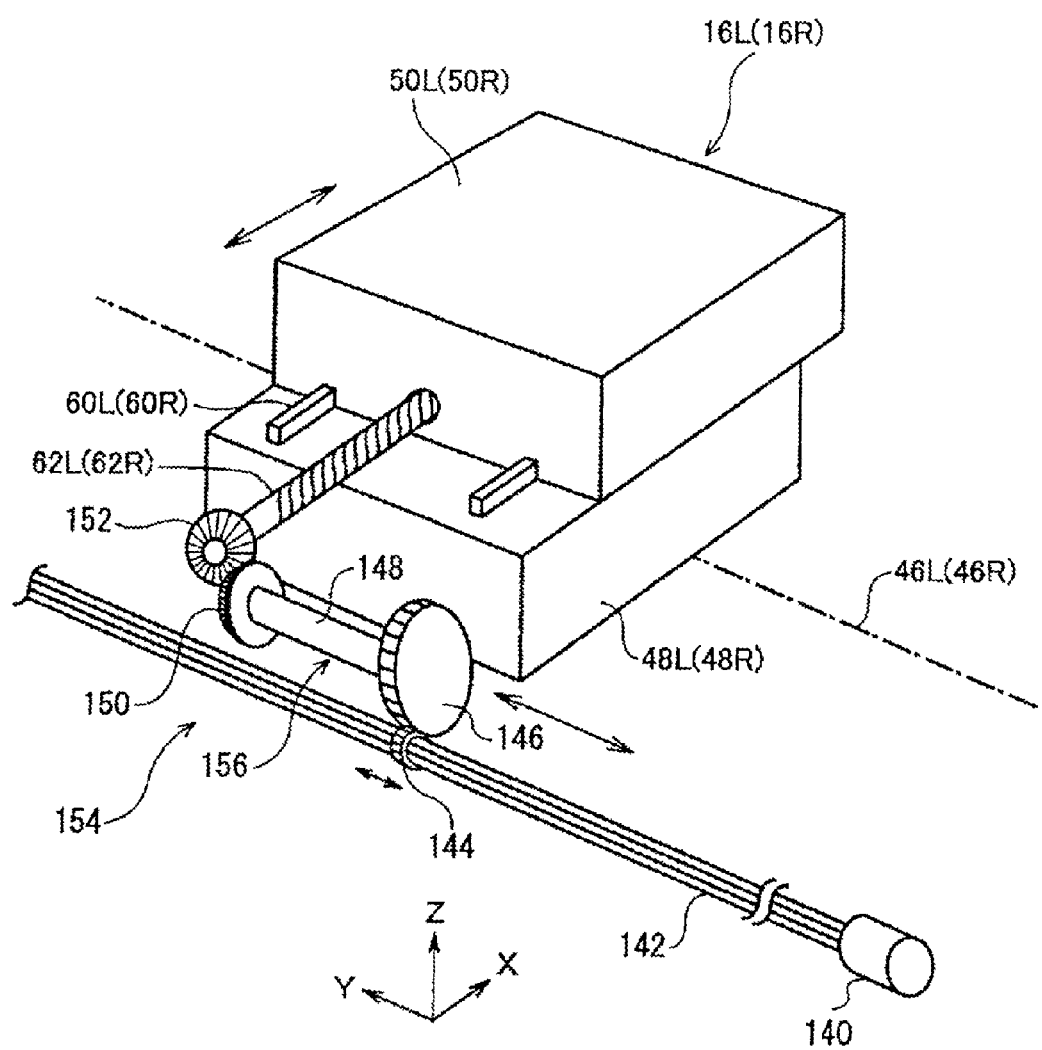
FIG. 17 is a perspective view showing a driving mechanism for sliding a transfer pedestal of a transfer robot according to an embodiment in an offset direction.

The transfer pedestal 50L is configured to slide in the offset direction (X direction) by a guide rail 60L and a ball screw mechanism 62L attached, for example, on a top surface of the transfer main body 48L. A driving source, i.e., a motor (now shown in FIG. 3), of the ball screw mechanism 62L may be attached to the transfer main body 48L, but as will be described later, may be disposed outside the platform PF (FIG. 17).

Figure 15:
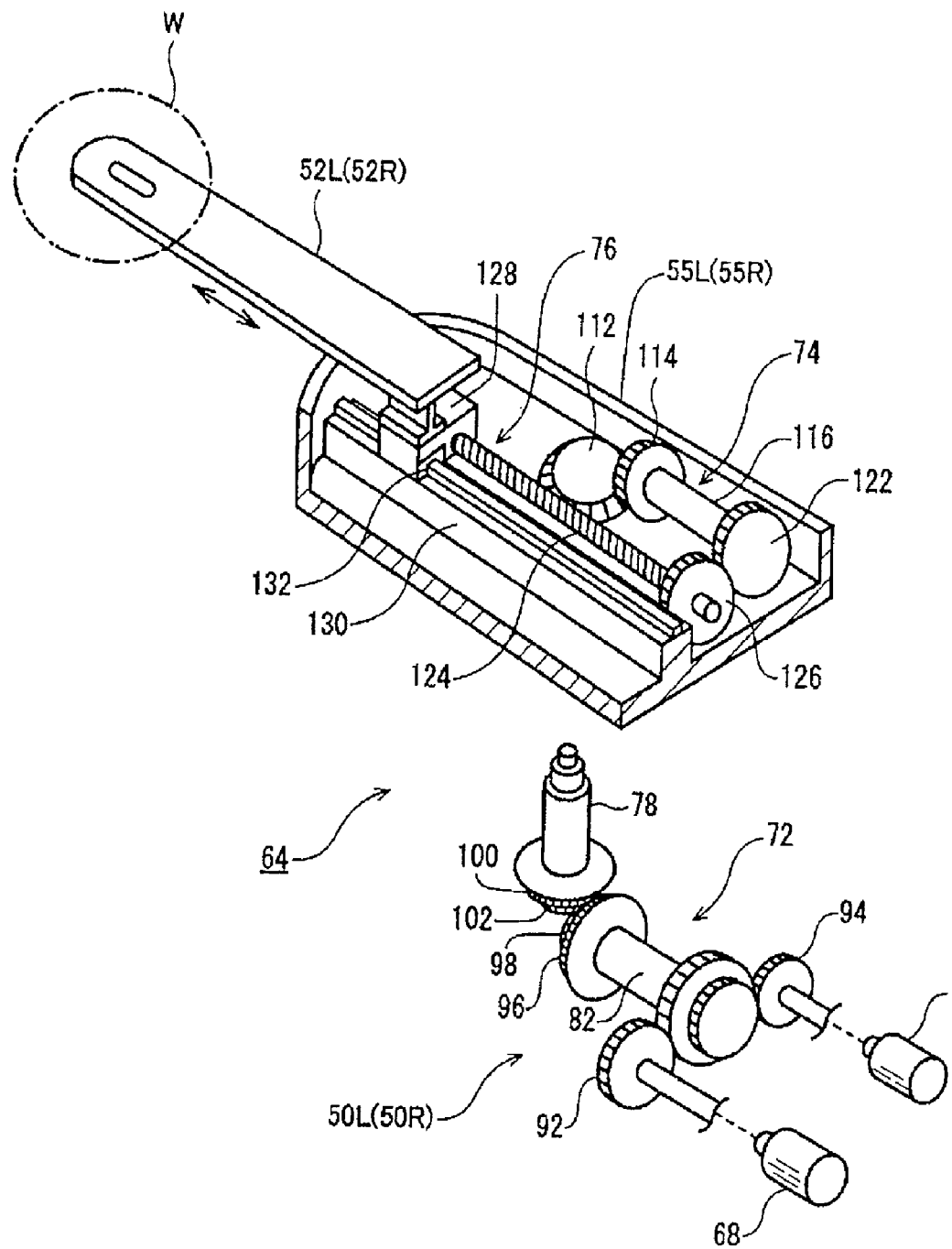
FIG. 15 is an exploded perspective view showing a configuration of an arm driving mechanism according to an embodiment.
Figure 16:
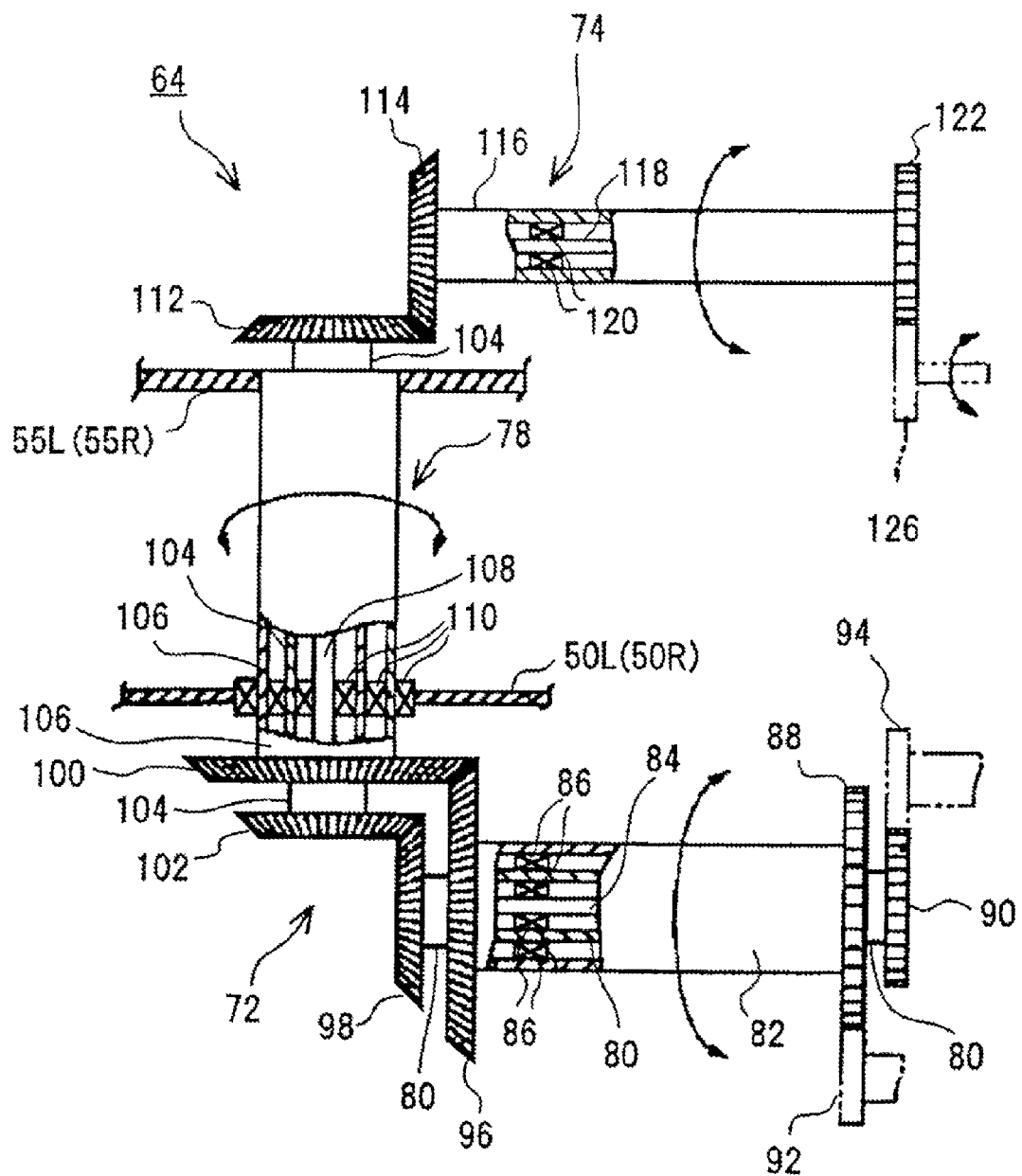
FIG. 16 is a partial side cross-sectional view showing a configuration of major components of the arm driving mechanism.

Configurations of the transfer arm 52L and an arm main body 55L will be described in detail later (FIGS. 15 and 16). The second transfer robot 16R has the same structure and functions as the first transfer robot 16L except that a motion or moving direction of each component of the second transfer robot 16R is vertically symmetrical to that of the first transfer robot 16L. Each component of the second transfer robot 16R in FIG. 3 has a reference numeral wherein the number is identical to that of a corresponding component of the first transfer robot 16L and "L" is replaced by "R".

Referring to FIG. 3, wafer transfer-in/out slots $M_1$, $M_2$, $M_3$, $M_4$, $M_5$, $M_6$, $M_a$, and $M_b$ formed on a side surface at predetermined intervals in a circumferential direction of the platform PF are respectively connected to the gate valves $GV_1$, $GV_2$, $GV_3$, $GV_4$, $GV_5$, $GV_6$, $GV_a$, and $GV_b$ (FIG. 1).

Here, a basic wafer transfer sequence for performing a series of processes on one piece of semiconductor wafer $W_i$ in the wafer cassette CR inserted into the load port LP, in the cluster tool will be described. The main controller 30, so as to perform the wafer transfer sequence, controls each component in the apparatus directly or indirectly through a local controller (not shown).

The atmosphere transfer robot 20 in the loader transfer chamber LM extracts one piece of semiconductor wafer $W_i$ from the wafer cassette CR on the load port LP, performs orientation flat adjustment by transferring the semiconductor wafer $W_i$ to the orientation flat adjusting mechanism ORT, and then transfers the semiconductor wafer $W_i$ to any one of the load lock chambers $LLC_a$ and $LLC_b$, for example, to the left load lock chamber $LLC_a$. The left load lock chamber $LLC_a$, i.e., a transfer place, receives the semiconductor wafer $W_i$ in an atmospheric pressure state, and vacuum-absorbs the interior after the semiconductor wafer $W_i$ is received therein, to deliver the semiconductor wafer $W_i$ to the first (left) transfer robot 16L of the platform PF at a depressurized state.

The first transfer robot 16L slides back and forth the transfer arm 52L between a backward location and a forward location to extract the semiconductor wafer $W_i$ from the left load lock chamber $LLC_a$, thereby transferring the semiconductor wafer $W_i$ into a first process chamber (for example, $PC_1$). In the process chamber $PC_1$, a single-wafer processing of a first process is performed in a predetermined process condition (gas, pressure, electric power, time, or the like), according to a pre-set recipe.

After the single-wafer processing of the first process is completed, any one of the first and second transfer robots 16L and 16R transfers the semiconductor wafer $W_i$ out from the process chamber $PC_1$, and transfers the transferred-out semiconductor wafer $W_i$ into a following second process chamber (for example, $PC_2$). Also in the second process chamber $PC_2$, a single-wafer processing of a second operation is performed in a predetermined process condition according to a pre-set recipe.

After the single-wafer processing of the second process is completed, any one of the first and second transfer robots 16L and 16R transfers the semiconductor wafer $W_i$ out from the second process chamber $PC_2$, and transfers the transferred-out semiconductor wafer $W_i$ into a third process chamber (for example, $PC_3$) if there is a next process, or transfers the transferred-out semiconductor wafer $W_i$ to any one of the load lock chambers $LLC_a$ and $LLC_b$ if there is no next process.

Even when a processing is performed in a process chamber (for example, $PC_5$) following the third process chamber, any one of the first and second transfer robots 16L and 16R transfers it into a latter process chamber (for example, $PC_6$) if there is a next process, or returns it back to any one of the load lock chambers $LLC_a$ and $LLC_b$ if there is no next process.

When the semiconductor wafer $W_i$, on which the series of processes are performed in the plurality of process chambers $PC_1$, $PC_2$, and so on in the cluster tool, is transferred into any one of the load lock chambers (for example, $LLC_b$), the interior of the load lock chamber $LLC_b$ is changed from a depressurized state to an atmospheric pressure state. Next, the atmosphere transfer robot 20 in the loader transfer chamber LM extracts the semiconductor wafer $W_i$ from the load lock chamber $LLC_b$ in the atmospheric pressure state to return it back to the corresponding wafer cassette CR. Also, in the load lock chamber $LLC_a$ or $LLC_b$ a heating or cooling processing on the staying semiconductor wafer $W_i$ under a desired atmosphere may be performed.

As described above, the vacuum processing apparatus of the cluster tool type can continuously perform a series of vacuum processings on the semiconductor wafer $W_i$ in line by sequentially transmitting the semiconductor wafer $W_i$ to the plurality of process chambers through the platform PF at a depressurized state, and, in particular, in a vacuum thin film-forming processing, different film-forming processings are performed consecutively so a desired thin film may be stacked and formed in line.

Next, a basic wafer transferring in/out operation of the first and second transfer robots 16L and 16R inside the platform PF according to the embodiment will be described with reference to FIGS. 4 through 10. For example, a scene where an operation of the first transfer robot 16L transferring a semiconductor wafer $W_i$ into the fifth process chamber $PC_5$, and an operation of the second transfer robot 16R transferring another semiconductor wafer $W_j$ out from the sixth process chamber $PC_6$ are simultaneously performed will be described. At this scene or in any scene as well, when at least one of the transfer robots 16L and 16R operates, the main controller 30 controls each component in the apparatus directly or indirectly through a local controller (not shown).

Figure 4:
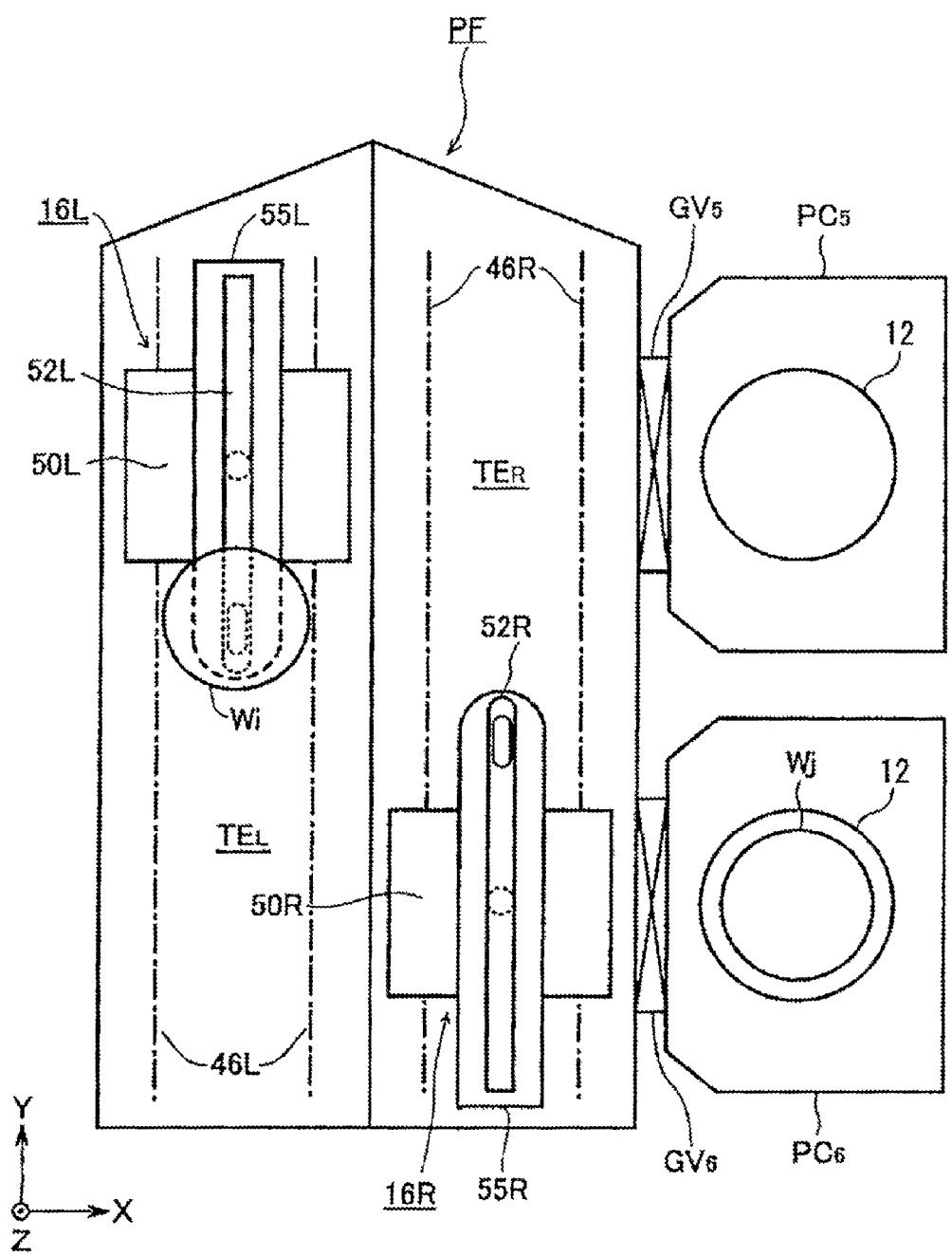
FIG. 4 is a schematic plan view showing a step of a wafer transferring in/out operation of first and second vacuum transfer robots in a platform, according to an embodiment.

First, as shown in FIG. 4, the first transfer robot 16L slides on the left guide rail 46L while holding the semiconductor wafer $W_i$ by using the transfer arm 52L, and stops nearly in front of the process chamber $PC_5$. Meanwhile, the second transfer robot 16R slides on the right guide rail 46R while a transfer arm 52R has nought (no load), and stops nearly in front of the process chamber $PC_6$.

Also in FIG. 4, the first and second transfer robots 16L and 16R are each taking a basic position. In other words, the transfer pedestals 50L and 50R are in an original location (backward location) on the transfer main bodies 48L and 48R, and the transfer arms 52L and 52R assume a position such as existing in an original location (backward location) that runs parallel with the inner depth direction (Y direction) on the transfer pedestals 50L and 50R and has the minimum rotation radius. In this basic position, the first transfer robot 16L may freely move in the inner depth direction (Y direction) within the left transfer area $TE_L$ without sticking out to the right transfer area $TE_R$. Also, the second transfer robot 16R may freely move in the inner depth direction (Y direction) within the right transfer area $TE_R$ without sticking out to the left transfer area $TE_L$. Accordingly, both transfer robots 16L and 16R may deviate from each other and one of them may outrun the other.

Figure 5:
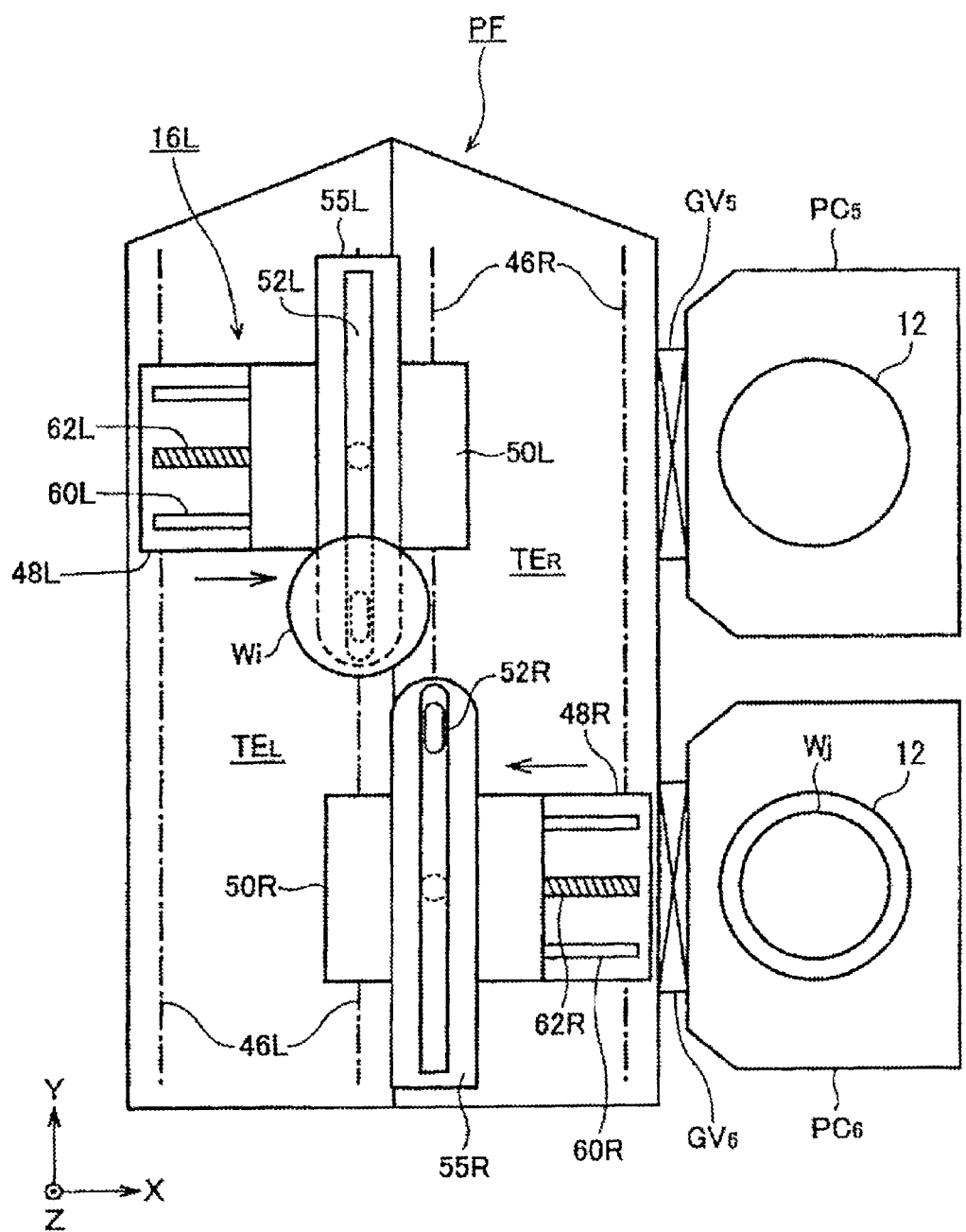
FIG. 5 is a schematic plan view showing a step of the wafer transferring in/out operation of the first and second vacuum transfer robot.

As such, after stopping nearly in front of the process chamber $PC_5$, the first transfer robot 16L slides the transfer pedestal 50L by a predetermined stroke from the basic position to the right on the transfer main body 48L so that the transfer pedestal 50L sticks out to the right transfer area $TE_R$, as shown in FIG. 5. Meanwhile, the second transfer robot 16R in front of the process chamber $PC_6$ slides the transfer pedestal 50R by a predetermined stroke from the basic position to the left on the transfer main body 48L so that the transfer pedestal 50R sticks out to the left transfer area $TE_L$.

Figure 6:
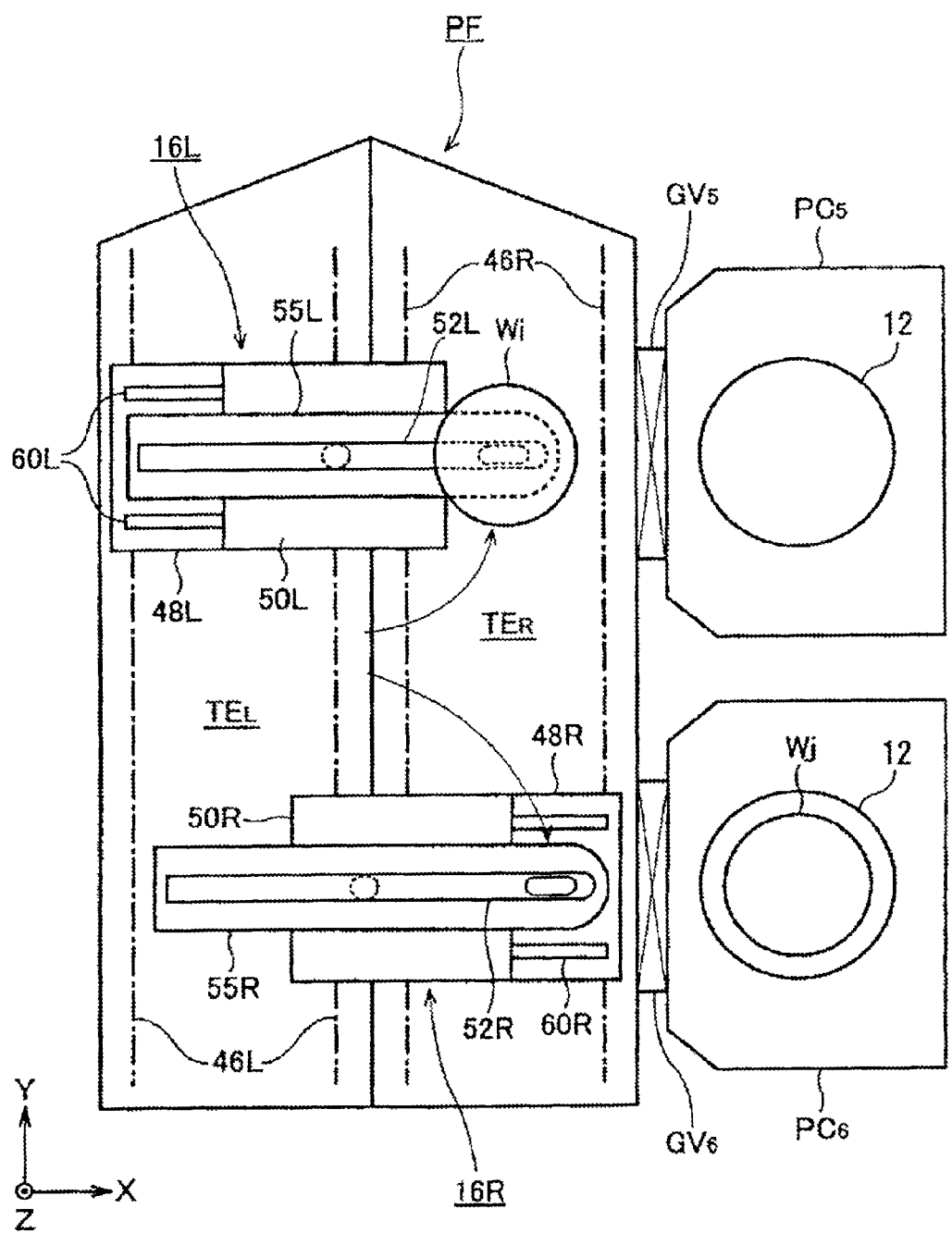
FIG. 6 is a schematic plan view showing a step of the wafer transferring in/out operation of the first and second vacuum transfer robot.

Next, as shown in FIG. 6, the first transfer robot 16L rotates the transfer arm 52L on the transfer pedestal 50L by a predetermined angle (about 90°) counterclockwise of FIG. 6, so that an arm front end portion (end effector) holding the semiconductor wafer $W_i$ faces the wafer transfer-in/out slot $M_5$ (FIG. 3). Also, the second transfer robot 16R rotates the transfer arm 52R on the transfer pedestal 50R by a predetermined angle (about 90°) clockwise of FIG. 6, so that an arm front end portion (end effector) having nought (no load) faces the wafer transfer-in/out slot $M_6$ (FIG. 3). Immediately after this, the gate valves $GV_5$ and $GV_6$ are each opened.

Figure 7:
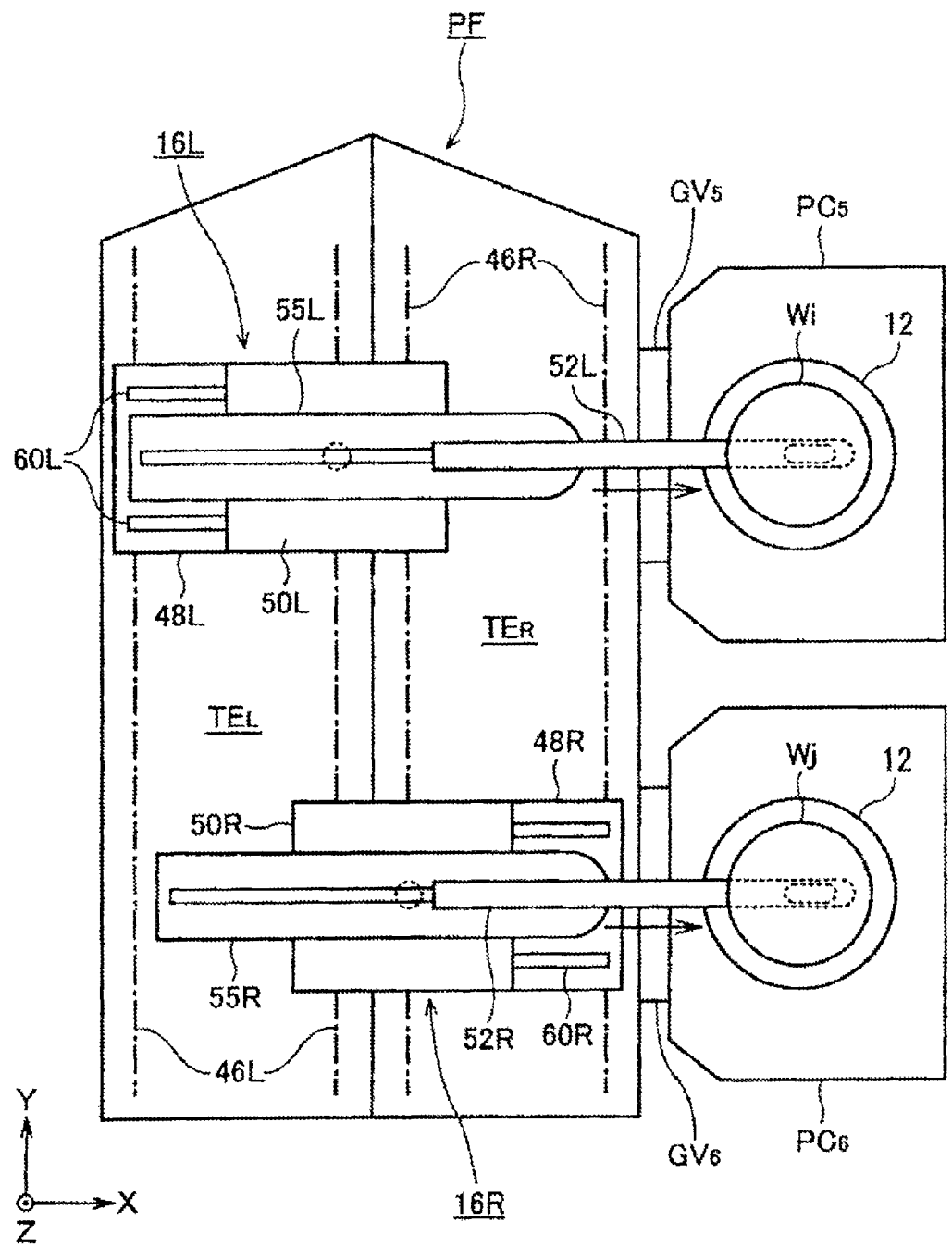
FIG. 7 is a schematic plan view showing a step of the wafer transferring in/out operation of the first and second vacuum transfer robot.

Then, as shown in FIG. 7, the first transfer robot 16L moves the transfer arm 52L straight to the front (forward movement) by a predetermined stroke to transfer the semiconductor wafer $W_i$ into the fifth process chamber $PC_5$, thereby delivering the semiconductor wafer $W_i$ above the holding stage 12. Here, a lift pin mechanism (not shown) included in the process chamber $PC_5$ places and receives the semiconductor wafer $W_i$ on a pin front end above the holding stage 12, and continuously unloads and places the semiconductor wafer $W_i$ on the holding stage 12. Meanwhile, the second transfer robot 16R moves the transfer arm 52R straight to the front (forward movement) by a predetermined stroke to insert the end effector of the transfer arm 52R into the sixth process chamber $PC_6$, thereby receiving the semiconductor wafer $W_j$ from a lift pin mechanism (not shown) above the holding stage 12.

Figure 8:
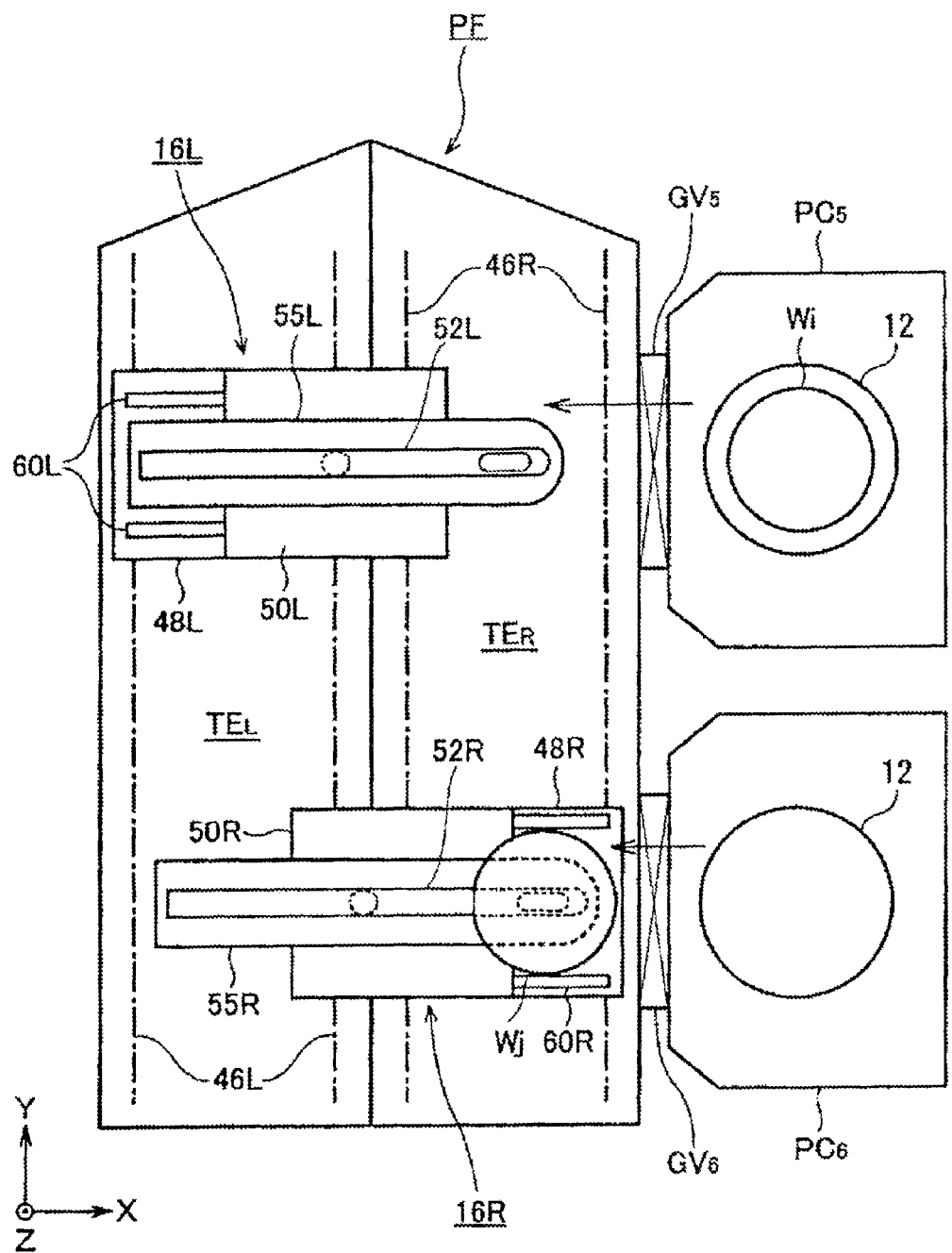
FIG. 8 is a schematic plan view showing a step of the wafer transferring in/out operation of the first and second vacuum transfer robot.

Next, as shown in FIG. 8, the first transfer robot 16L moves the transfer arm 52L having nought (no load) straight to the back (backward movement) and returns it back into the platform PF, thereby completing an operation of transferring the semiconductor wafer $W_i$ into the process chamber $PC_5$. The second transfer robot 16R moves the transfer arm 52R holding the semiconductor wafer $W_j$ straight to the back (backward movement) and returns it back into the platform PF, thereby completing an operation of transferring the semiconductor wafer $W_j$ out from the process chamber $PC_6$.

Then, according to the transfer recipe, the first and second transfer robots 16L and 16R respectively head for next destinations, and perform required wafer transferring in/out operations. For example, afterward, it is assumed that the first transfer robot 16L is programmed with an operation of transferring another semiconductor wafer $W_k$ out from the third process chamber $PC_3$, and the second transfer robot 16R is programmed with an operation of transferring the semiconductor wafer $W_j$ into the left load lock chamber $LLC_b$.

Figure 9:
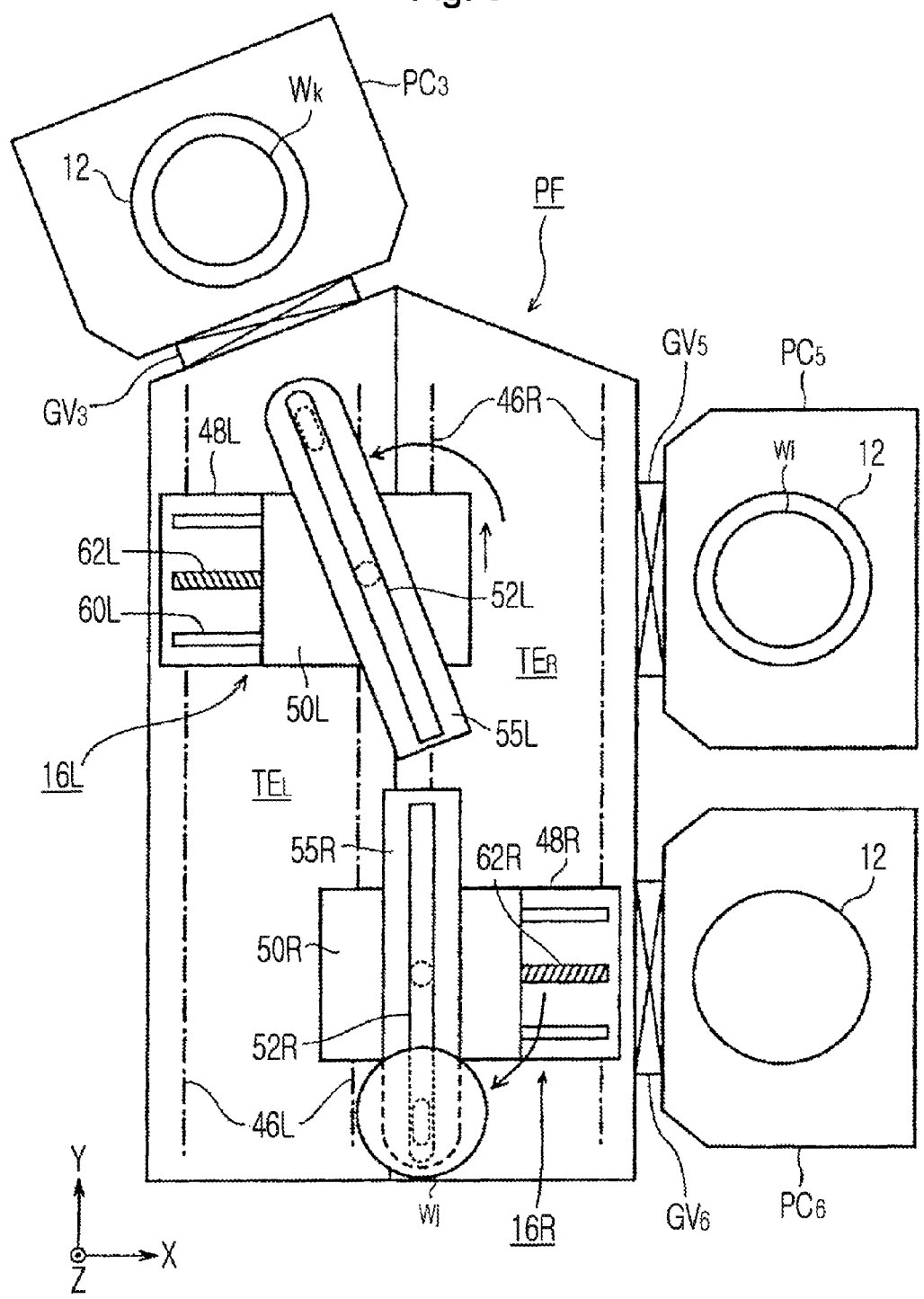
FIG. 9 is a schematic plan view showing a step of the wafer transferring in/out operation of the first and second vacuum transfer robot.

In this case, as shown in FIG. 9, the first transfer robot 16L moves the transfer main body 48L in the inner depth direction (Y direction) to approach the third process chamber $PC_3$ while the transfer pedestal 50L is sticking out to the right transfer area $TE_R$, and at the same time, rotates the transfer arm 52L by a predetermined angle (about 120°) in a counterclockwise direction of FIG. 9 so that the arm front end portion (end effector) faces the wafer transfer-in/out slot $M_3$ (FIG. 3). Meanwhile, the second transfer robot 16R rotates the transfer arm 52R by a predetermined angle (about 90°) in a clockwise direction of FIG. 9.

Figure 10:
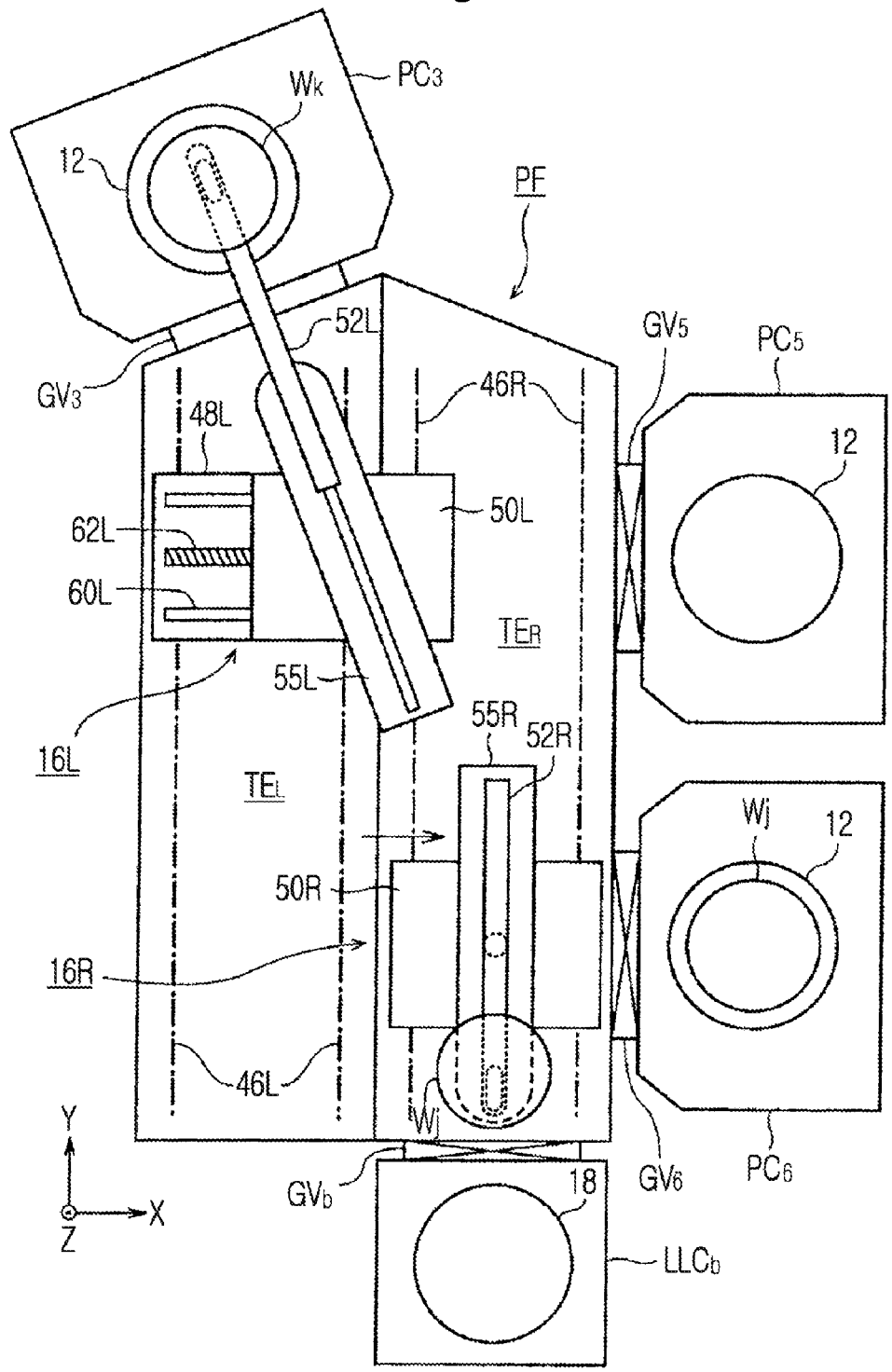
FIG. 10 is a schematic plan view showing a step of the wafer transferring in/out operation of the first and second vacuum transfer robot.

Then, as shown in FIG. 10, the first transfer robot 16R moves the transfer arm 52L straight to the front (forward movement) by a predetermined stroke, thereby inserting the end effector of the transfer arm 52L into the third process chamber $PC_3$. Meanwhile, the second transfer robot 16R returns the transfer pedestal 50L back to the original location on the transfer main body 48R and allows the end effector of the transfer arm 52R holding the semiconductor wafer $W_j$ to face the front of the right load lock chamber $LLC_b$, i.e., the wafer transfer-in/out slot $M_b$ (FIG. 3).

Next, although not shown, the first transfer robot 16L moves the transfer arm 52L having the semiconductor wafer $W_k$ received thereon straight to the back (backward movement) by a predetermined stroke, thereby completing an operation of transferring the semiconductor wafer $W_k$ out from the third process chamber $PC_3$. Meanwhile, the second transfer robot 16R moves the transfer arm 52R straight to the front (forward movement) by a predetermined stroke to deliver the semiconductor wafer $W_j$ to the receiving/delivering stage 18 in the right load lock chamber $LLC_b$, and moves the transfer arm 52R having nought (no load) straight to the back (backward movement), thereby completing an operation of transferring the semiconductor wafer $W_j$ into the right load lock chamber $LLC_b$.

Then, the first and second transfer robots 16L and 16R each perform scheduled wafer transfer operations in parallel, without interfering with each other, according to a transfer recipe.

According to the present embodiment, a mutual location relationship between the first and second transfer robots 16L and 16R when simultaneously operating in the platform PF may have 4 patterns, as shown in FIGS. 11 through 14.

Figure 11:
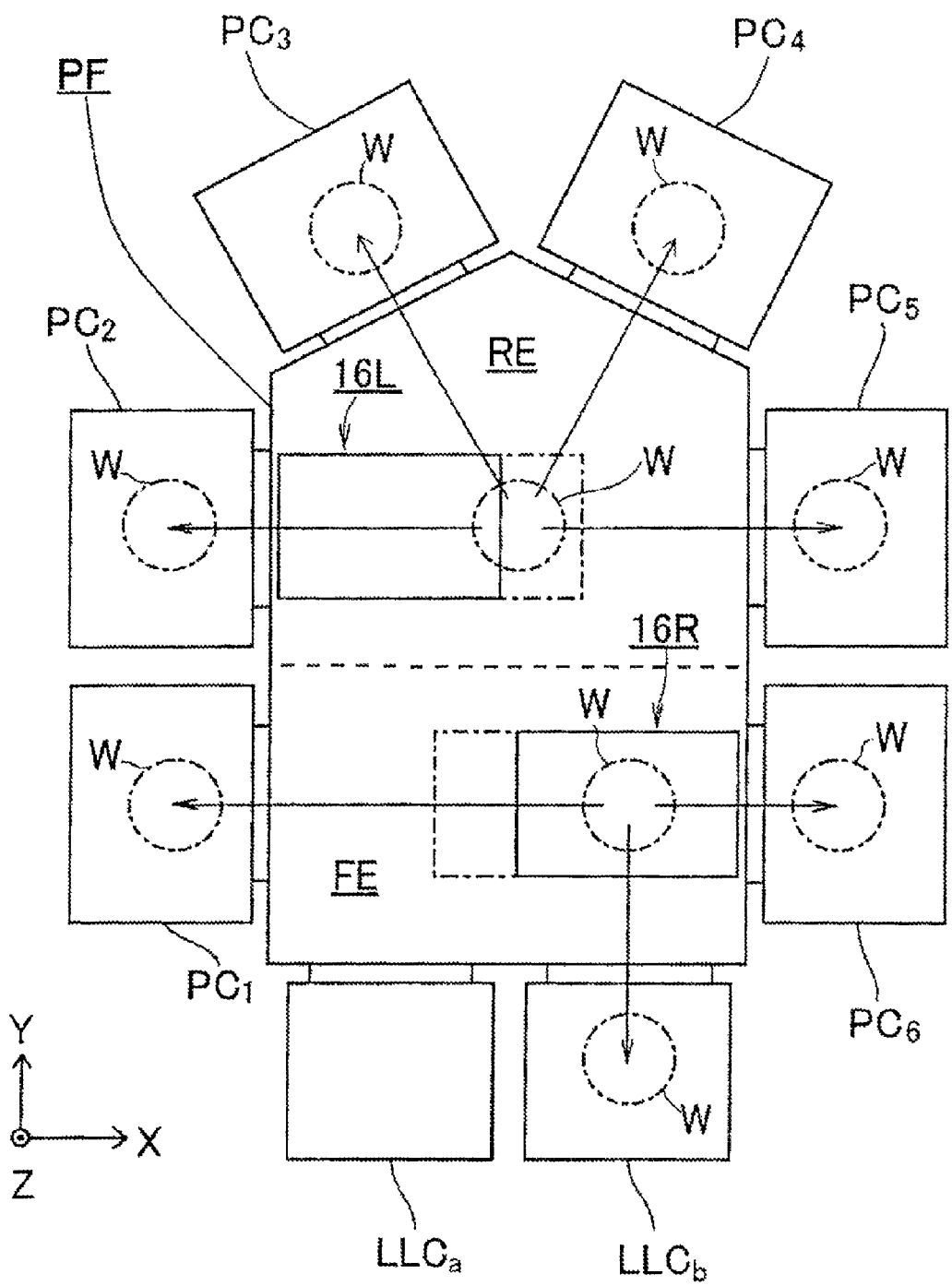
FIG. 11 is a schematic plan view showing a first pattern according to a mutual location relationship between the first and second transfer robots that simultaneously operate in the platform.

A first pattern, as shown in FIG. 11, is a case where the first transfer robot 16L operates in a rear transfer area RE, and the second transfer robot 16R operates in a front transfer area FE. Also, when a transfer space in the platform PF is nearly halved in the inner depth direction (Y direction), a front half of the transfer space is referred to as the front transfer area FE and an inner half of the transfer space is referred to as the rear transfer area RE, as viewed from the load lock chamber $LLC_a$ and $LLC_b$ side.

In the first pattern, the first transfer robot 16L operates each component (the transfer main body 48L, the transfer pedestal 50L, and the transfer arm 52L) so as to arbitrarily access the second, third, fourth, and fifth process chambers $PC_2$, $PC_3$, $PC_4$, and $PC_5$, thereby transferring the semiconductor wafer W in/out. Meanwhile, the second transfer robot 16R operates each component (the transfer main body 48R, the transfer pedestal 50R, and the transfer arm 52R) so as to arbitrarily access the first and sixth process chambers $PC_1$ and $PC_6$ and the right load lock chamber $LLC_b$, thereby transferring the semiconductor wafer W in/out.

Figure 12:
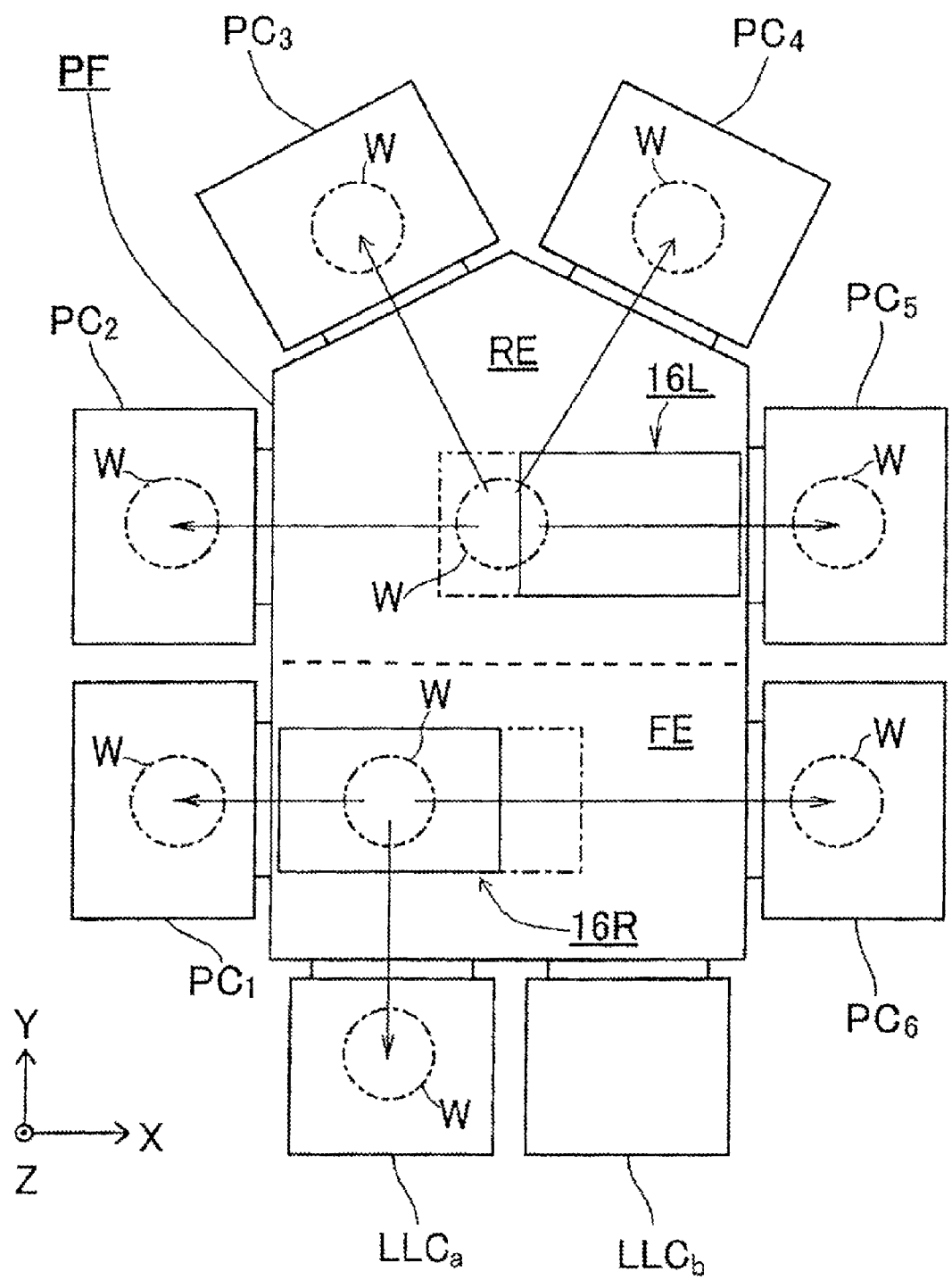
FIG. 12 is a schematic plan view showing a second pattern according to a mutual location relationship between the first and second transfer robots.

A second pattern, as shown in FIG. 12, on the contrary to the first pattern, is a case where the first transfer robot 16L operates in the front transfer area FE, and the second transfer robot 16R operates in the rear transfer area RE. Here, the first transfer robot 16L may arbitrarily access the first and sixth process chambers $PC_1$ and $PC_6$, and the left load lock chamber $LLC_a$, thereby transferring the semiconductor wafer W in/out. Also, the second transfer robot 16R may arbitrarily access the second, third, fourth, and fifth process chambers $PC_2$, $PC_3$, $PC_4$, and $PC_5$, thereby transferring the semiconductor wafer W in/out.

Figure 13:
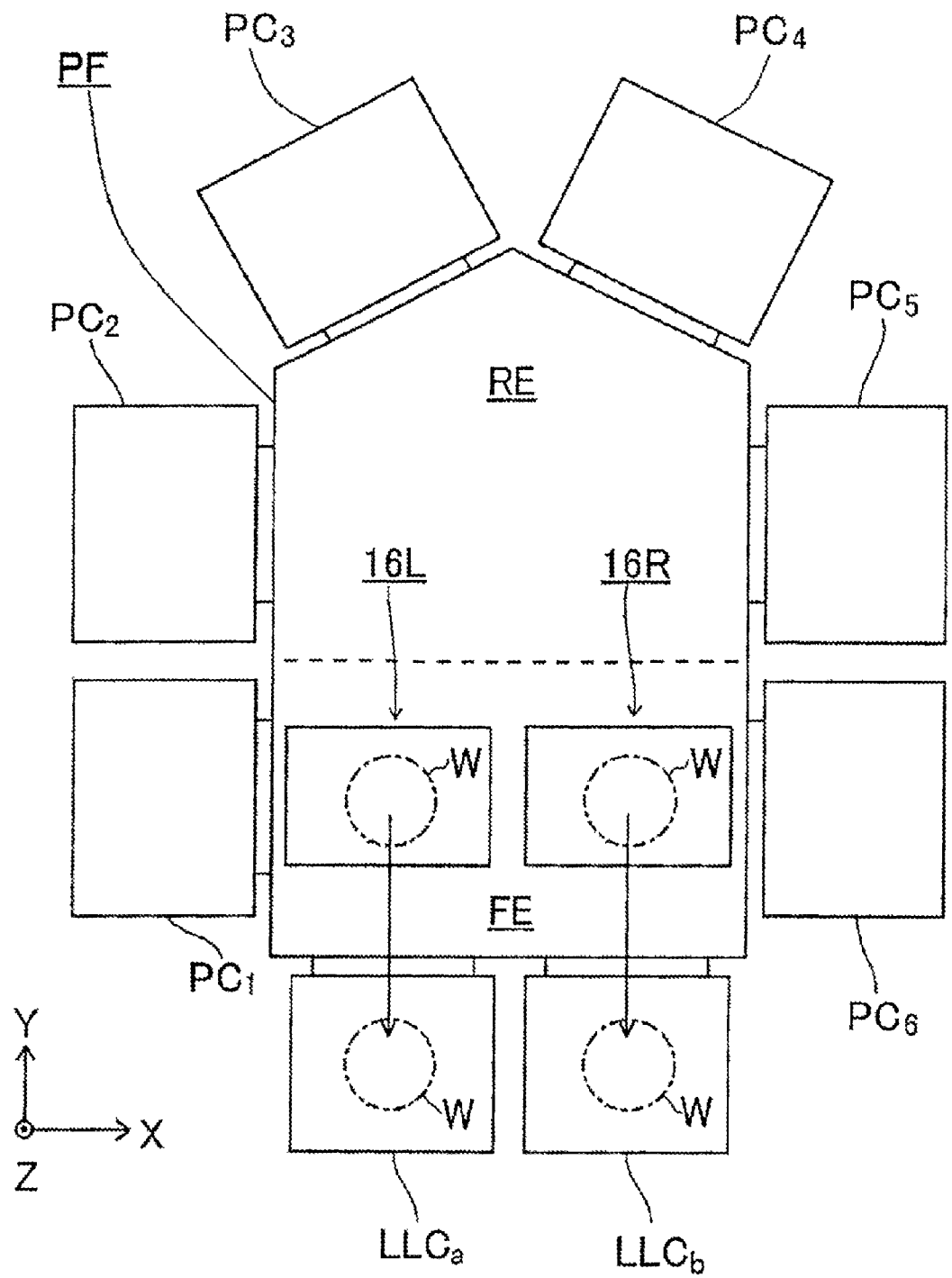
FIG. 13 is a schematic plan view showing a third pattern according to a mutual location relationship between the first and second transfer robots that simultaneously operate in the platform.

A third pattern, as shown in FIG. 13, is a case where the first and second transfer robots 16L and 16R operate together in the front transfer area FE. In this case, the first transfer robot 16L may access only the left load lock chamber $LLC_a$ to transfer the semiconductor wafer W in/out, and the second transfer robot 16R may access only the right load lock chamber $LLC_b$ to transfer the semiconductor wafer W in/out.

Figure 14:
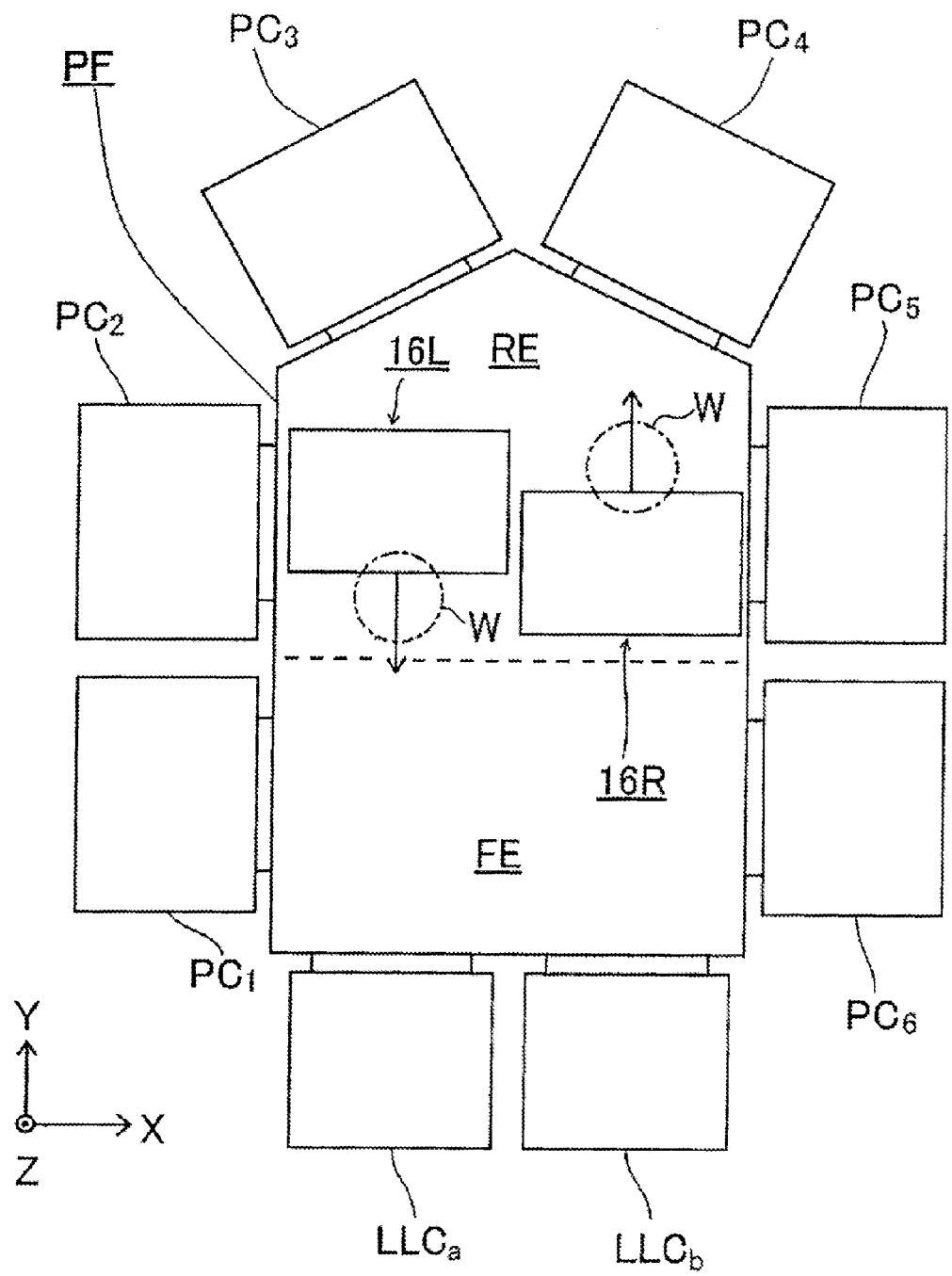
FIG. 14 is a schematic plan view showing a fourth pattern according to a mutual location relationship between the first and second transfer robots.

A fourth pattern, as shown in FIG. 14, is a case where the first and second transfer robots 16L and 16R operate together in the rear transfer area RE. In this case, both transfer robots 16L and 16R cannot but only move on the respective transfer paths 46L and 46R (FIGS. 1 through 11) in the basic position. However, as described above, they are movable in the same direction and in the opposite directions, and may deviate from each other.

As described above, in the vacuum processing apparatus of the cluster tool, the plurality (six) of process chambers $PC_1$ through $PC_6$ and the plurality (two) of load lock chambers $LLC_a$ and $LLC_b$ are disposed adjacent to and around the platform PF, and at the same time, the first and second transfer robots 16L and 16R are formed in the platform PF.

The first transfer robot 16L may use the left transfer area $TE_L$ of the platform PF as the main operation area but still may stick out to the right transfer area $TE_R$, and may perform an access to transfer a wafer from/to all chambers $PC_1$ through $PC_6$ and $LLC_a$ except the right load lock chamber $LLC_b$. Meanwhile, the second transfer robot 16R may use the right transfer area $TE_R$ of the platform PF as the main operation area and still stick out to the left transfer area $TE_L$, and may perform an access to transfer a wafer from/to all chambers $PC_1$ through $PC_6$ and $LLC_b$ except the left load lock chamber $LLC_a$.

Each of the transfer robots 16L and 16R perform any either transferring-in or transferring-out of the semiconductor wafer W at one access, and thus is unable to transfer out a semiconductor wafer $W_i$ and alternately transfer in another semiconductor wafer $W_j$ according to a so-called pick and place operation. However, both transfer robots 16L and 16R are continuously operated by suitably combining the four parallel operating patterns (FIGS. 11 through 14), and thus any one of the transfer robots 16L and 16R may transfer out a semiconductor wafer $W_i$ just in time, and then the other one (the same one in some cases) may transfer in another semiconductor wafer $W_j$ just in time, with respect to any one of the process chambers $PC_1$ through $PC_6$.

The wafer transfer method according to the present embodiment advantageously operates particularly in cases where the unprocessed semiconductor wafer $W_j$ cannot be transferred into alternately immediately after the semiconductor wafer $W_i$ that has been processed is transferred out in any one of the process chambers $PC_1$ through $PC_6$. Typically, a post-processing (for example, a cleaning processing), which is to be performed without a wafer immediately after an original vacuum single-wafer processing, takes a long time in a process chamber (for example, $PC_4$). In this case, according to the present embodiment, a transfer robot that transferred the semiconductor wafer $W_i$ having been processed from the process chamber $PC_4$, for example, the left transfer robot 16L, may immediately transfer the semiconductor wafer $W_i$ into another process chamber (for example, $PC_5$) where a following process is to be performed, or if there is no following process, may immediately transmit the semiconductor wafer $W_i$ to the left load lock chamber $LLC_a$, without having to wait in front of the process chamber $PC_4$ until the post-process is completed. Also, immediately after the post-process is completed in the process chamber $PC_4$, the right transfer robot 16R (or the left transfer robot 16L) may transfer the unprocessed semiconductor wafer $W_j$ in by accessing the process chamber $PC_4$ just in time.

Also, in a case of a cluster tool where at least three process chambers PC are disposed on each of right and left long sides of the platform PF by lengthening the inner depth size of the platform PF, since an operation space of the vacuum transfer apparatus in the platform PF greatly enlarges in the inner depth direction, advantages of the two transfer robots 16L and 16R operating as above become more noticeable.

Next, an arm driving mechanism 64 for driving the transfer arm 52L (52R) installed on the transfer robot 16L (16R) according to the present embodiment will be described.

As shown in FIGS. 15 and 16, the arm driving mechanism 64 is formed over the transfer pedestal 50L (50R) and the arm main body 55L (55R). In detail, a rotation driving motor 68, a straight-movement driving motor 70, and a first gear mechanism 72 are formed on the transfer pedestal 50L (50R) side while a second gear mechanism 74 and a ball screw mechanism 76 are formed on the arm main body 55L (55R) side, and a connection bar 78 is vertically formed between the transfer pedestal 50L (50R) and an arm main body 55L (55R).

In the transfer pedestal 50L (50R), the first gear mechanism 72 includes an inner horizontal rotation shaft 80 and an outer horizontal rotation shaft 82, which have coaxial cylindrical structures. As shown in FIG. 16, a bearing 86 is each formed between the inner horizontal rotation shaft 80 and the outer horizontal rotation shaft 82, and between the inner horizontal rotation shaft 80 and a central shaft 84.

A spur gear 88 is fixed to one end of the outer horizontal rotation shaft 82, and a spur gear 90 is fixed to one end of the inner horizontal rotation shaft 80 at the outside in an axis direction. The spur gears 88 and 90 are respectively engaged with spur gears 92 and 94 connected to the rotation driving motor 68 and the straight-movement driving motor 70.

A bevel gear 96 is fixed to the other end of the outer horizontal rotation shaft 82, and a bevel gear 98 is fixed to the other end of the inner horizontal rotation shaft 80 at the outside in the axis direction. The bevel gears 96 and 98 are respectively engaged with bevel gears 100 and 102 adhered to the bottom of the connection bar 78.

The connection bar 78 has an inner vertical rotation shaft 104 and an outer vertical rotation shaft 106, which have coaxial cylindrical structures. As shown in FIG. 16, a bearing 110 is each formed between the inner vertical rotation shaft 104 and the outer vertical rotation shaft 106, between the inner vertical rotation shaft 104 and a central shaft 108, and between the outer vertical rotation shaft 106 and a ceiling plate of the transfer pedestal 50L (50R). The bevel gear 100 is fixed to one end (bottom) of the outer vertical rotation shaft 106, and the bevel gear 102 is fixed to one end (bottom) of the inner vertical rotation shaft 104 at the outside in the axis direction.

The other end (top) of the outer vertical rotation shaft 106 is fixed to a bottom plate of the arm main body 55L (55R), and a bevel gear 112 is fixed to the other end (top) of the inner vertical rotation shaft 104 at the outside (upward) in the axis direction, i.e. inside the arm main body 55L (55R). A bevel gear 114 of the second gear mechanism 74 is engaged with the bevel gear 112.

In the arm main body 55L (55R), the second gear mechanism 74 has a horizontal rotation shaft 116 of a cylindrical shape. As shown in FIG. 16, a bearing 120 is formed between the horizontal rotation shaft 116 and a central shaft 118.

The bevel gear 114 is fixed to one end of the horizontal rotation shaft 116, and a spur gear 122 is fixed to the other end thereof. The spur gear 122 is engaged with a spur gear 126 fixed to one end of a transfer screw 124 of the ball screw mechanism 74.

The transfer arm 52L (52R) is formed of one plate body, and a ball screw 128 that is screw-coupled to the transfer screw 124 is adhered to a base end of the transfer arm 52L (52R). Also, a guide rail 130 extending in parallel to the transfer screw 124 is formed, and a guide portion 132 sliding on the guide rail 130 is also adhered to the base end of the transfer arm 52L (52R).

In the arm driving mechanism 64 having such a configuration, when the rotation driving motor 68 is operated, the outer vertical rotation shaft 106 rotates as the rotation driving power of the rotation driving motor 68 is transmitted to the outer vertical rotation shaft 106 through the spur gear 92, the spur gear 88, the outer horizontal rotation shaft 82, the bevel gear 96, and the bevel gear 100, and thus the arm main body 55L (55R) rotates integrally with the outer vertical rotation shaft 106. A rotation direction (clockwise direction/counter-clockwise direction) and a rotation angle of the arm main body 55L (55R) may be controlled by controlling a rotation direction and rotation amount of the motor 68.

Also, when the straight-movement driving motor 70 is operated, the transfer screw 124 rotates as the rotation driving power of the straight-movement driving motor 70 is transmitted to the transfer screw 124 of the ball screw mechanism 76 through the spur gear 94, the spur gear 90, the inner horizontal rotation shaft 80, the bevel gear 98, the bevel gear 102, the inner vertical rotation shaft 104, the bevel gear 112, the bevel gear 114, the horizontal rotation shaft 116, the spur gear 122, and the spur gear 126, and thus the transfer arm 52L (52R) slides in an arm length direction, i.e., a radius direction of a rotation circle. A moving direction (forward/backward) and stroke of the transfer arm 52L (52R) may be controlled by controlling a rotation direction and rotation amount of the motor 70.

In the present embodiment, since components of the transfer robots 16L and 16R, i.e., the transfer main body 48L (48R), the transfer pedestal 50L (50R), and the transfer arm 52L (52R), are all configured to slide or rotate in a horizontal direction, and the components neither bend and stretch, nor rotate in a longitudinal (vertical) direction, a large operation space in the longitudinal (vertical) direction is not required. Accordingly, a longitudinal size of the platform PF may be reduced, and thus a layout of protruding the APC valve 34, which is included in the process module PM besides the platform PF, to the space 38 (FIG. 2) right below the platform is possible as described above. In addition, in the platform PF, since a component of a transfer mechanism does not pass above the semiconductor wafer W, a concern that particles adhere to the semiconductor wafer W is resolved. Also, in the platform PF, since the semiconductor wafer W is not accelerated in a longitudinal (vertical) direction (specifically upward), the semiconductor wafer W is stably maintained on the transfer arm 52L (52R).

Moreover, in a configuration where each component of the transfer robots 16L and 16R is uniformly made to be a horizontal slide/horizontal rotating type mechanism as the embodiment, a driving source of each component may be easily disposed outside the platform PF, and accordingly, a joint duct or a flexible pipe accommodating electric cables or the like is not required to surround inside the platform PF. Thus, large moving ranges or large slide strokes of the transfer robots 16L and 16R may be obtained.

Figure 18:
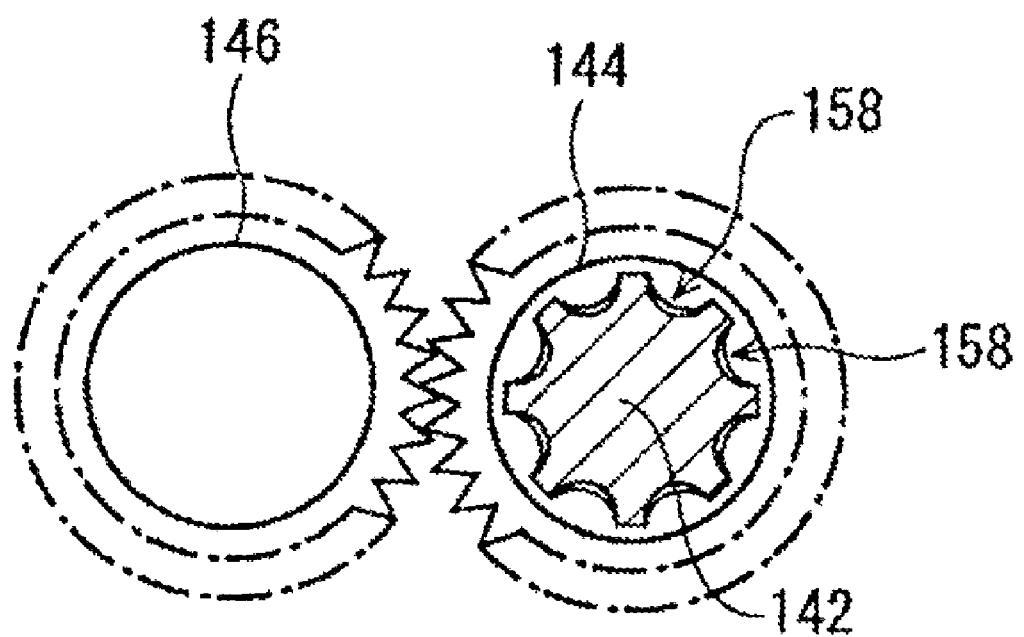
FIG. 18 is a cross-sectional view showing a cross-sectional structure of a spline shaft used in the driving mechanism of FIG. 17.

For example, as shown in FIGS. 17 and 18, in a mechanism for sliding the transfer pedestal 50L (50R) in an offset direction (X direction) on the transfer main body 48L (48R), an electric motor 140, which is a driving source, may be disposed outside the platform PF by interposing an electric mechanism 154 including a spline shaft 142, a spur gear 144, a spur gear 146, a horizontal rotation shaft 148, a bevel gear 150, and a bevel gear 152, between the ball screw mechanism 62L (62R) of the transfer pedestal 50L (50R) side and the electric motor 140.

In FIG. 17, the spur gear 146, the horizontal rotation shaft 148, and the bevel gear 150 are integrally formed into a gear mechanism 156, and are connected to the transfer main body 48L (48R). As shown in FIG. 18, grooves 158 extending in an axis direction are formed on an outer circumference of the spline shaft 142, and the spur gear 144 is configured to move along the grooves 158 in the axis direction together with the gear mechanism 156.

While the present invention has been particularly shown and described with reference to exemplary embodiments thereof, it will be understood by those of ordinary skill in the art that various changes in form and details may be made therein without departing from the spirit and scope of the present invention as defined by the following claims.

For example, a slide motion of each component in the transfer robots 16L and 16R may not be necessarily straight, but may bend as occasion demands.

Also, according to the above embodiment, the two load lock chambers $LLC_a$ and $LLC_b$ are disposed on both sides, respectively, of the bottom side of the pentagonal platform PF, so that the first transfer robot 16L accesses only the left load lock chamber $LLC_a$ and the second transfer robot 16R accesses only the right load lock chamber $LLC_b$. However, for example, the base of the platform PF may be changed to two oblique sides of an isosceles triangle (the platform PF is hexagonal) and the load lock chambers $LLC_a$ and $LLC_b$ may be connected to the two oblique sides, so that both of the transfer robots 16L and 16R may access to any of the load lock chambers $LLC_a$ and $LLC_b$.

Also, although not shown, if there is an enough space in the platform PF, a plurality of transfer arms 52L (52R) may be formed on both or one of the transfer robots 16L and 16R. In this case, for example, a so-called pick and place operation is possible, wherein one transfer arm transfers out (pick) a semiconductor wafer that has been processed, and another transfer arm transfers in (place) an unprocessed semiconductor wafer alternately, at one access to a process chamber.

The target object in the present invention is not limited to the semiconductor wafer, and may be, for example, an FPD substrate, or any target object on which a certain process is performed in the vacuum processing apparatus of the cluster tool.

DESCRIPTION OF REFERENCE NUMERALS

PF: platform (vacuum transfer chamber)
$PC_1 \sim PC_6$: process chamber
$LLC_a$ and $LLC_b$: load lock chamber
$GV_1 \sim GV_6$, $GV_a$ and $GV_b$: gate valve
16L: first vacuum transfer robot
16R: second vacuum transfer robot
46L: left guide rail
46R: right guide rail
48L (48R): transfer main body
50L (50R): transfer pedestal
52L (52R): transfer arm
55L (55R): arm main body
64: arm driving mechanism

The invention claimed is:
1. A vacuum processing apparatus comprising:
a vacuum transfer chamber of which the interior is maintained at a depressurized state;
one or more vacuum process chambers, which are formed adjacent to and around the vacuum transfer chamber and where a predetermined process on a target object is performed in a depressurized interior;

one or more load lock chambers, which are formed adjacent to and around the vacuum transfer chamber and have the interior that is selectively changed to an atmosphere state or a depressurized state to temporarily lock the target object transmitted between an atmosphere space and the vacuum transfer chamber;

first and second vacuum transfer robots formed in the vacuum transfer chamber to transfer the target object, between the load lock chamber and at least one of the vacuum process chambers, or between the vacuum process chambers that are different from each other, wherein the first and second vacuum transfer robots are configured to move inside the vacuum transfer chamber respectively on first and second transfer paths that extend in inner depth directions respectively in a left transfer area and a right transfer area of the vacuum transfer chamber, as viewed from the load lock chamber side, the first vacuum transfer robot has access to all the vacuum process chambers adjacent to the left transfer area, at least one of the vacuum process chambers adjacent to the right transfer area, and at least one of the load lock chambers, so as to transfer in or out the target object, and the second vacuum transfer robot has access to all the vacuum process chambers adjacent to the right transfer area, at least one of the vacuum process chambers adjacent to the left transfer area, and at least one of the load lock chambers, so as to transfer in or out the target object.

2. The vacuum processing apparatus of claim 1, wherein the first vacuum transfer robot is configured to arbitrarily switch between a basic position, wherein the first vacuum transfer robot is entirely contained in the left transfer area to move, and a position, wherein the first vacuum transfer robot sticks out from the left transfer area to the right transfer area, and the second vacuum transfer robot is configured to arbitrarily switch between a basic position, wherein the second vacuum transfer robot is entirely contained in the right transfer area to move, and a position, wherein the second vacuum transfer robot sticks out from the right transfer area to the left transfer area.

3. The vacuum processing apparatus of claim 1, wherein the first and second vacuum transfer robots respectively comprise:

first and second transfer main bodies configured to move inside the vacuum transfer chamber respectively on the first and second transfer paths;

first and second transfer pedestals installed respectively on the first and second transfer main bodies so as to move in a horizontal offset direction crossing the inner depth direction; and first and second transfer arms installed respectively in the first and second transfer pedestals so as to rotate within a horizontal surface while moving straight in a direction parallel to a radius of a rotation circle, and configured to support the target object.

4. The vacuum processing apparatus of claim 3, wherein the first and second transfer main bodies slide respectively on the first and second transfer paths.

5. The vacuum processing apparatus of claim 3, wherein the first and second transfer main bodies are movable while deviating from each other on the first and second transfer paths.

6. The vacuum processing apparatus of claim 3, wherein the first transfer pedestal is movable between a first backward location in which the first transfer pedestal is contained within the left transfer area, and a first forward location in which the first transfer pedestal sticks out from the left transfer area to the right transfer area, and the second transfer pedestal is movable between a second backward location in which the second transfer pedestal is contained within the right transfer area, and a second forward location in which the second transfer pedestal sticks out from the right transfer area to the left transfer area.

7. The vacuum processing apparatus of claim 3, wherein the first and second transfer pedestals are installed respectively in the first and second transfer main bodies in such a way that the first and second transfer pedestals are slidable in the offset direction.

8. The vacuum processing apparatus of claim 3, wherein each of the first and second transfer arms has an end effector for supporting one target object.

9. The vacuum processing apparatus of claim 3, wherein each of the first and second transfer arms has an end effector for supporting a plurality of target objects.

10. The vacuum processing apparatus of claim 3, wherein the transfer main body is formed in a location higher than a bottom surface of the vacuum process chamber.

11. The vacuum processing apparatus of claim 1, wherein all driving sources used by the first and second vacuum transfer robots are formed outside the vacuum transfer chamber.

12. The vacuum processing apparatus of claim 1, wherein a predetermined post-process is performed in at least one of the vacuum process chambers immediately after a target object that has been processed is transferred out and when there is no target object inside the at least one of the vacuum process chambers.

13. A vacuum transfer apparatus formed in a vacuum transfer chamber of a vacuum processing apparatus, the vacuum processing apparatus comprising:

one or more vacuum process chambers, which are formed adjacent to and around a vacuum transfer chamber and have the interior that is maintained at a depressurized state, and where a predetermined process on a target object is performed in a depressurized interior; and one or more load lock chambers, which are formed adjacent to the transfer chamber and have the interior that is selectively changed to an atmosphere state or a depressurized state to temporarily lock the target object transmitted between an atmosphere space and the vacuum transfer chamber, the vacuum transfer apparatus, which receives or delivers the target object between the vacuum transfer chamber and the vacuum process chamber or between the vacuum transfer chamber and the load lock chamber, comprising:

first and second vacuum transfer robots configured to move inside the vacuum transfer chamber respectively on first and second transfer paths that extend in inner depth directions respectively in a left transfer area and a right transfer area of the vacuum transfer chamber, as viewed from the load lock chamber side, wherein the first vacuum transfer robot has access to all the vacuum process chambers adjacent to the left transfer area, at least one of the vacuum process chambers adjacent to the right transfer area, and at least one of the load lock chambers, so as to transfer in or out the target object, and the second vacuum transfer robot has access to all the vacuum process chambers adjacent to the right transfer area, at least one of the vacuum process chambers adjacent to the left transfer area, and at least one of the load lock chambers, so as to transfer in or out the target object.

14. The vacuum transfer apparatus of claim 13, wherein the first vacuum transfer robot is configured to arbitrarily switch between a basic position, wherein the first vacuum transfer robot is entirely contained in the left transfer area to move, and a position, wherein the first vacuum transfer robot sticks out from the left transfer area to the right transfer area, and the second vacuum transfer robot is configured to arbitrarily switch between a basic position, wherein the second vacuum transfer robot is entirely contained in the right transfer area to move, and a position, wherein the second vacuum transfer robot sticks out from the right transfer area to the left transfer area.

15. The vacuum transfer apparatus of claim 13, wherein the first and second vacuum transfer robots respectively comprise:

first and second transfer main bodies configured to move inside the vacuum transfer chamber respectively on the first and second transfer paths;

first and second transfer pedestals installed respectively on the first and second transfer main bodies so as to move in a horizontal offset direction crossing the inner depth direction; and first and second transfer arms installed respectively in the first and second transfer pedestals so as to rotate within a horizontal surface while moving straight in a direction parallel to a radius of a rotation circle, and configured to support the target object.

\* \* \* \* \*